United States Patent [19]
Kimura

[11] Patent Number: 5,506,537
[45] Date of Patent: Apr. 9, 1996

[54] LOGARITHMIC AMPLIFYING CIRCUIT BASED ON THE BIAS-OFFSET TECHNIQUE

[75] Inventor: Katsuji Kimura, Tokyo, Japan

[73] Assignee: NEC Corporation, Tokyo, Japan

[21] Appl. No.: 274,413

[22] Filed: Jul. 13, 1994

[30] Foreign Application Priority Data

Jul. 14, 1993 [JP] Japan .................................. 5-196994

[51] Int. Cl.$^6$ .............................. G06F 7/556; G06G 7/24
[52] U.S. Cl. ........................... 327/351; 327/352; 327/307
[58] Field of Search .................................. 327/350, 351, 327/352, 353, 307, 104, 303, 354, 184, 531

[56] References Cited

U.S. PATENT DOCUMENTS

| 4,794,342 | 12/1988 | Kimura | 330/2 |
| 4,990,803 | 2/1991 | Gilbert | 307/492 |
| 5,057,717 | 10/1991 | Kimura | 327/352 |
| 5,345,185 | 9/1994 | Gilbert | 327/350 |

FOREIGN PATENT DOCUMENTS

| 0505751 | 9/1992 | European Pat. Off. . |
| 62-293807 | 12/1987 | Japan . |
| 62-292010 | 12/1987 | Japan . |
| 4-165805 | 6/1992 | Japan . |

OTHER PUBLICATIONS

K. Kimura, "Some Circuit Design Techniques for . . . on low Supply Voltage", *IEEE Transactions on Circuits and Systems—I: Fundamental Theory and Applications*, vol. 39, No. 9, Sep. 1992, pp. 771–777.
K. Kimura, "A Unified Analysis of Four-Quadrant . . . Transistors Operable on Low Supply Voltage", *IEICE Trans. Electron.*, vol. E76-C, No. 5, May 1993, pp. 714–737.

*Primary Examiner*—Toan Tran
*Attorney, Agent, or Firm*—Sughrue, Mion, Zinn, Macpeak & Seas

[57] ABSTRACT

A logarithmic amplifying circuit with a reduced power dissipation and suitable for applying to an integrated circuit. The logarithmic amplifying circuit has cascade-connected differential amplifiers, a rectifier connected to each if the amplifiers and an adder for adding the output currents of the rectifiers. Each of the rectifiers has a differential pair composed of a plurality of transistors emitter-coupled or source-coupled, a constant current source for a tail current of the differential pair and an offset voltage source for superimposing a DC offset voltage on a differential input voltage to be supplied to the differential pair.

25 Claims, 14 Drawing Sheets

– 5,506,537 –

LOGARITHMIC AMPLIFYING CIRCUIT BASED ON THE BIAS-OFFSET TECHNIQUE

BACKGROUND OF THE INVENTION

1. Field of the Invention

The present Invention relates to a logarithmic amplifying circuit, and relates in particular to a logarithmic amplifying circuit suitable to be formed on a bipolar integrated circuit or a CMOS integrated circuit.

2. Description of the Related Art

Logarithmic amplifying circuits have been used in a variety of fields for outputting a logarithmic answer in response to an input signal. For realizing a logarithmic amplifying circuit, there are methods such as a first method which uses a logarithmic characteristic region included in a current-voltage characteristic curve for a PN junction, and a second method which provides a plurality of nonlinear amplifiers to combine output signals from each amplifier in order to obtain the approximate logarithmic characteristic of the output signals. According to the first method, it is possible to get logarithmic output signals with accuracy in the range from picoampere levels to several hundred microamperes. However, inasmuch as the frequency bandwidth for the output signals is narrow and depends on signals, it cannot be applied to, for example, an IF (intermediate frequency) stage of a radio receiver. In contrast, according to the second method, it is possible to expand the frequency band, the method being also applicable to the IF amplifier or the like. Further, as a third method for realizing a logarithmic amplifying circuit, there is for example the method disclosed in U.S. Pat. No. 4,794,342 and Japanese Patent Laid-open Gazettes No. 292010/87 (JP, A, 62-292010) and No. 165805/92 (JP, A, 4-165805) all by the present inventor. According to the method, a plurality of cascade-connected differential amplifiers and a plurality of rectifiers are provided for the full-wave square-law detection of a differential input of each stage and a differential output of the last stage, and then output signals of these rectifiers are summed up to obtain a synthetic logarithmic output.

FIG. 1 is a block diagram showing a basic structure of a logarithmic amplifying circuit according to the third method. In FIG. 1, there are m number of differential amplifiers $91_1$ to $91_m$ cascade-connected in such a manner that a differential output signal from a former stage is inputted to a subsequent stage as a differential input signal. In FIG. 1, (m+1) number of rectifiers $92_1$ to $92_{m+1}$ are also provided and differential input signals to be inputted into differential amplifiers $91_1$ to $91_m$ are also inputted to rectifiers $92_1$ to $92_m$ respectively. Further, a differential output signal of the differential amplifier $91_m$ of the last stage is inputted into the (m+1)-th rectifier $92_{m+1}$. Rectifiers $92_1$ to $92_{m+1}$ are structured such that each rectifier outputs, as a current signal, a full-wave rectified signal which is proportional to the square of the input voltage when the input voltage is within a range of the upper and lower limits of predetermined values. Each rectifier also outputs an electric current of a first predetermined value when the input voltage is over the upper limit and outputs an electric current of a second predetermined value when the input voltage is less than the lower limit. Further, an adder 93 is provided to add all output currents $I_{RS1}$ to $I_{RS(m+1)}$ from respective rectifiers $92_1$ to $92_{m+1}$ for calculating the total sum. The output from the adder 93 becomes the output signal of the logarithmic amplifying circuit.

FIG. 2 shows, with reference to the logarithmic amplifying circuit of FIG. 1, the relation between the output currents $I_{RS1}$ to $I_{RS(m+1)}$ from respective rectifiers $92_1$ to $92_{m+1}$ and an addition current $I_{RSSt}$ of the adder 93. The horizontal axis of FIG. 2 is expressed in a dB scale, i.e., in a logarithmic scale. In the diagram, a symbol $G_O$ represents an amplification factor (gain) of each of differential amplifiers $91_1$ to $91_{m+1}$. As shown in the diagram, the synthetic amplification factor is given as $(m+1)G_O$, proving that logarithmic amplification has been achieved. Inasmuch as the logarithmic amplifying circuit implements logarithmic approximation by means of a number of rectifiers, the propriety of the logarithmic characteristic or the propriety of the approximation to the logarithmic characteristic is determined depending on the circuits or the rectifying characteristics of each full-wave rectifier. It is to be noted that the synthetic amplification factor can be adjusted by changing the amplification factor of each of differential amplifiers $91_1$ to $91_{m+1}$.

As a rectifier to be used in the logarithmic amplifying circuit of this kind having a full-wave square rectification characteristic, as shown in the above Laid-open documents, there is a rectifier familiar that is well known to the public in which input signals supplied to two pairs of unbalanced differential pairs composed of bipolar transistors or MOS transistors are cross-coupled and output signals therefrom are parallel-connected. The unbalanced differential pair can be prepared, if necessary, by using bipolar transistors each having an emitter of a different area or by using MOS transistors each having a different ratio of channel width W to channel length L, that is, a different value of W/L. The relation between the ratios of emitter areas or (W/L)s and the full-wave rectification characteristics of transistors composing the unbalanced differential pair is disclosed in detail in the literature by the present inventor, "K. Kimura, IEEE Transactions on Circuits and Systems-I, Vol. 39, No. 9, pp. 771–777, September 1992". By referring to the literature, it becomes possible to constitute a proper half- and full-wave rectifiers.

However, in two pairs of unbalanced differential pairs of the conventional logarithmic amplifying circuit, since collectors of a larger size or drains of a larger size are coupled with each other, the resulting capacity becomes large and the drive current tends to be increased for expanding the frequency characteristic to the high frequency area.

In the U.S. Pat. No. 4,990,803 by B. Gilbert, there is disclosed a logarithmic amplifying circuit in which a full-wave rectifier is structured with two pairs of bipolar differential pairs parallelly connected, and this full-wave rectifier is disposed in each stage of cascade-connected differential amplifiers. In the full-wave rectifier of the circuit by B. Gilbert, a DC offset voltage with a different sign is superimposed on the base of each transistor which constitutes the differential pair, and a logarithmic dynamic range per full-wave rectifier is about 10 dB. Therefore, in order to provide a logarithmic amplifying circuit, it is necessary to cascade-connect differential amplifiers each having a gain of about 10 dB. Consequently, a number of differential amplifiers are required to obtain a logarithmic dynamic range of a desired level resulting in the increase of the dissipation current.

Thus, the conventional logarithmic amplifying circuit described above has a structure which is disadvantageous for realizing a low dissipation current.

SUMMARY OF THE INVENTION

An object of the present invention is to constitute a full-wave rectifier used in a logarithmic amplifying circuit with transistors having collectors or drains of a small area and provide a logarithmic amplifying circuit which can easily be formed on an integrated circuit and is driven by a small current.

An object of the present invention is achieved by a logarithmic amplifying circuit which comprises a differential amplifier, a plurality of rectifiers provided corresponding to input and output terminals of the logarithmic amplifying circuit, and an adder for adding the output from each of the rectifiers; wherein each rectifier further includes a differential pair consisting of a plurality of transistors which are emitter-coupled or source-coupled, and offset means for superimposing a DC offset voltage on a differential input voltage to be supplied to the differential pair.

An object of the present invention can also be achieved according to a logarithmic amplifying circuit which comprises a plurality of cascade-connected differential amplifiers, a plurality of rectifiers for receiving a differential input of a differential amplifier of each stage and a differential output of the differential amplifier of the last stage, respectively, and outputting differential currents corresponding to the received input signals and an adder for adding the differential current of each rectifier and outputting signals according to the sum thus obtained; wherein the rectifier includes a differential pair consisting of a single tail current source and two MOS transistors whose sources are connected to the tail current source, and offset means for superimposing a DC offset voltage on a differential input voltage to be supplied to the differential pair, gates of the MOS transistors are provided for receiving input signals of the rectifier, and drains of the MOS transistors is provided for transmitting output signals of the rectifier.

An object of the present invention can also be achieved according to a logarithmic amplifying circuit which comprises a plurality of cascade-connected differential amplifiers, a plurality of rectifiers for receiving a differential input of a differential amplifier of each stage and a differential output of the differential amplifier of the last stage, respectively, and outputting differential currents corresponding to the received input signals and an adder for adding the differential current of each rectifier and outputting signals according to the sum thus obtained; wherein the rectifier comprises a differential pair including a single tail current source and two bipolar transistors whose emitters are connected to the tail current source, and offset means for superimposing a DC offset voltage on a differential input voltage to be supplied to the differential pair, gates of the bipolar transistors are provided for receiving the differential input of the rectifier and emitters of the bipolar transistors are provided for transmitting the differential output of the rectifier.

An object of the present invention can also be achieved according to a logarithmic amplifying circuit which comprises a plurality of cascade-connected differential amplifiers, a plurality of full-wave rectifiers for receiving a differential input of a differential amplifier of each stage and a differential output of the differential amplifier of the last stage, respectively, and outputting differential currents corresponding to the received input signals and an adder for adding the differential current of each full-wave rectifier and outputting signals according to the sum thus obtained; wherein the full-wave rectifier further comprises a double differential pair consisting of two parallel-connected differential pairs of the same characteristic and offset means provided for each of the differential pairs for superimposing a DC offset voltage on the differential input voltage of the corresponding differential pair; wherein each of the differential pairs is consisting of a tail current source and two transistors whose sources or emitters are commonly connected to the tail current source, and the polarity of the DC offset voltage for one differential pair is reverse to the polarity of the DC offset voltage for the other differential pair.

The above and other objects, features and advantages of the present invention will become apparent from the following description referring to the accompanying drawings which illustrate examples of preferred embodiments of the present invention.

DESCRIPTION OF THE PREFERRED EMBODIMENTS

Figure 1:
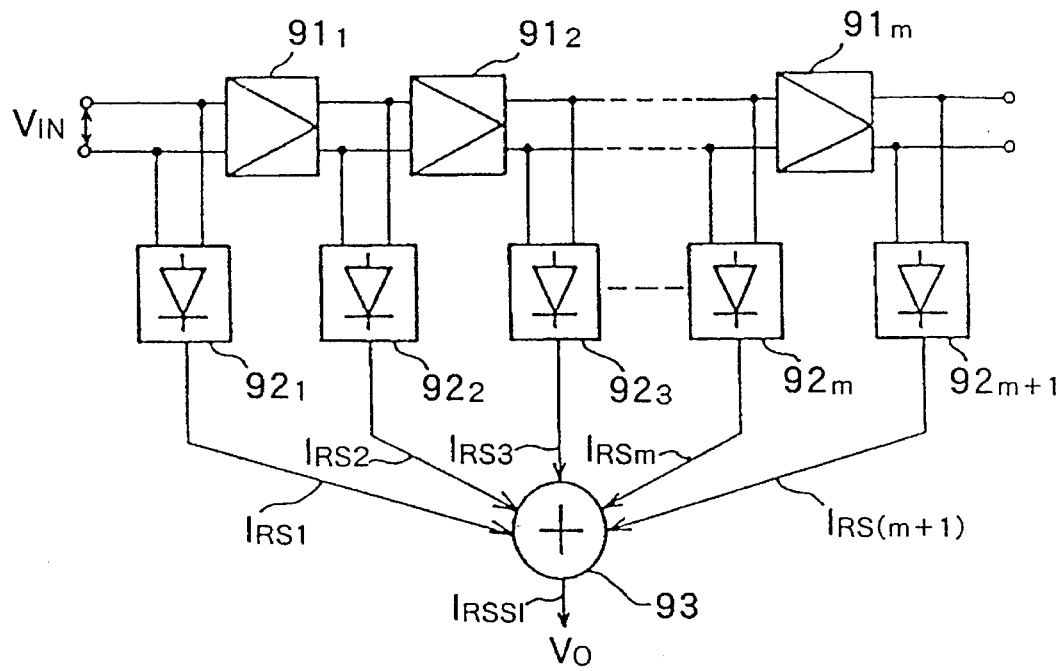
FIG. 1 is a block diagram showing the structure of a logarithmic amplifying circuit which employs cascade-connected differential amplifiers, and rectifiers.
Figure 2:
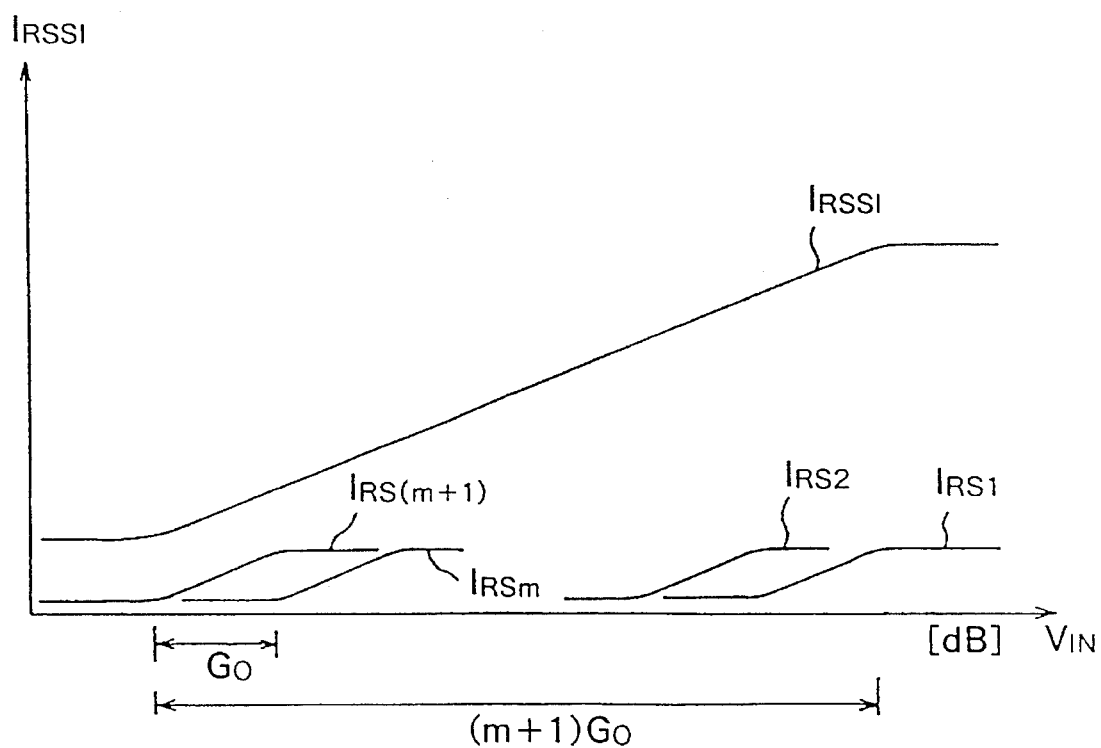
FIG. 2 is a diagram showing a characteristic of rectified currents in the logarithmic amplifying circuit of FIG. 1.
Figure 3:
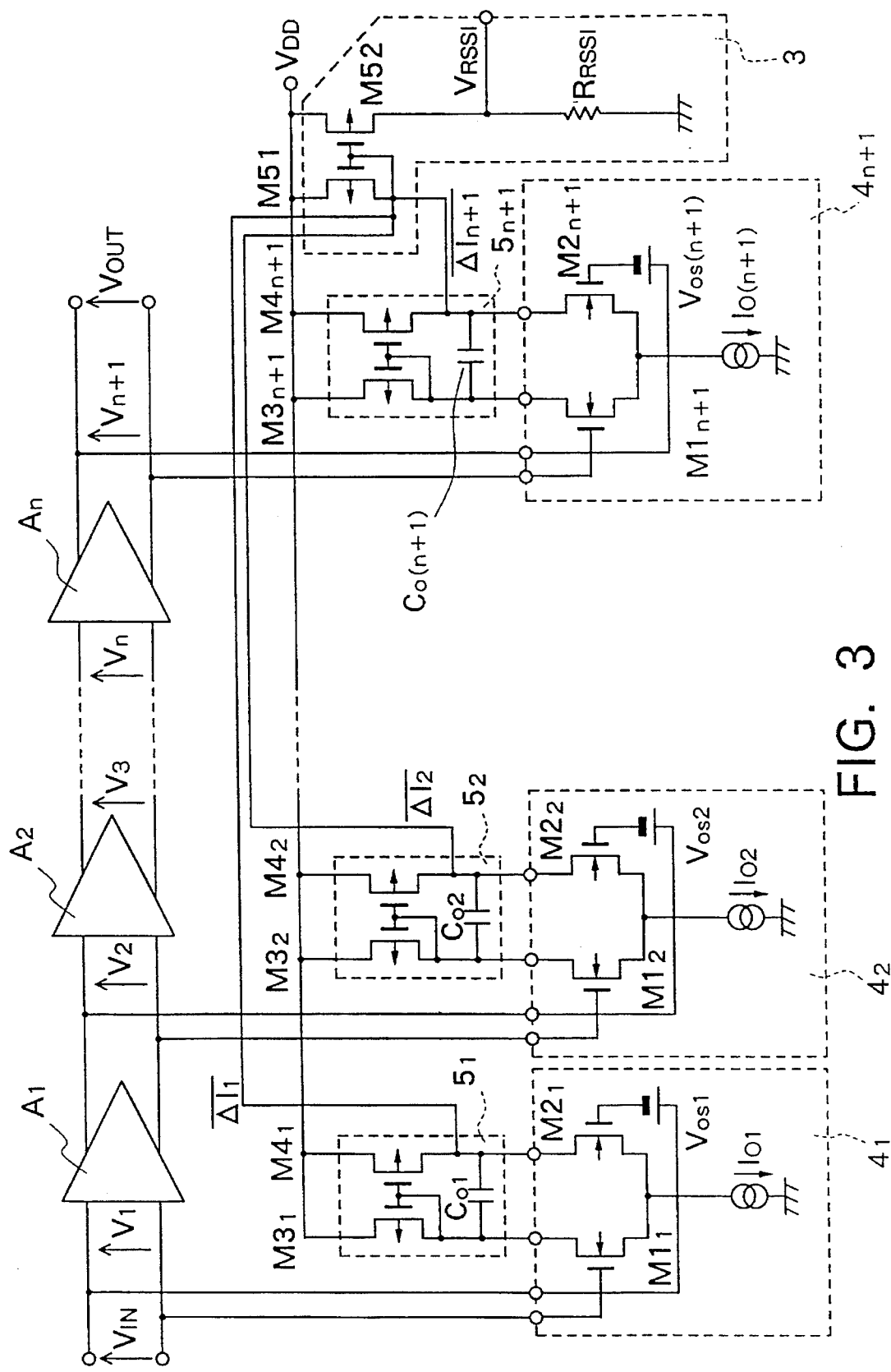
FIG. 3 is a block diagram showing the structure of a logarithmic amplifying circuit of an embodiment of the present invention.

A preferred embodiment of the present invention will next be described with reference to the drawings. A logarithmic amplifying circuit shown in FIG. 3 is constituted according to a CMOS process comprising a number n of differential amplifiers $A_1$ to $A_n$, a number (n+1) of half-wave rectifiers $4_1$ to $4_{n+1}$, a number (n+1) of active loads $5_1$ to $5_{n+1}$ and an adder 3. In FIG. 3, each of differential amplifiers $A_1$ to $A_n$ has an identical gain being cascade-connected to each other and a differential output from the differential amplifier of a former stage becomes a differential input to the differential amplifier of a subsequent stage. A differential input of the differential amplifier $A_1$ of the first stage represents the input to this logarithmic amplifying circuit and $V_{IN}$ represents the input voltage to the circuit. A differential input voltage of the differential amplifier $A_i$ of the i-th stage is expressed as $V_i$, and a differential output voltage of a differential amplifier $A_n$ of the last stage is expressed as $V_{n+1}$. Therefore, the output voltage $V_{OUT}$ of the differential amplifier series is expressed as $V_{n+1}$.

Each of half-wave rectifiers $4_1$ to $4_{n+1}$ comprises a MOS coordinate differential pair composed of two N channel MOS transistors whose sources are commonly connected, a constant current source for producing a tail current for this differential pair, and an offset voltage source for superimposing a DC offset voltage on the input voltage to be supplied to the MOS differential pair. In concrete, the j-th ($1 \leq j \leq n+1$) half-wave rectifier $4_j$ comprises, a pair of differential input terminals and a pair of differential output terminals, first and second MOS transistors $M1_j$, $M2_j$ whose sources are commonly connected, a constant current source $I_{Oj}$ for a tail current placed between the node of these sources and the ground, and an offset voltage source for applying a DC offset voltage $V_{osj}$ on the gate voltage of the second transistor $M2_j$. The drains of transistors $M1_j$, $M2_j$ are connected to the differential output terminals respectively, the gate of the first transistor $M1_j$ is connected to one input terminal and the gate of the second transistor $M2_j$ is connected to the other input terminal through the offset voltage source $V_{osj}$. The differential input terminals of each of half-wave rectifiers $4_1$ to $4_n$ are connected to lines for receiving differential input signals of differential amplifiers $A_1$ to $A_n$ respectively, and the differential input terminals of the remaining half-wave rectifier $4_{n+1}$ are connected to lines for receiving a differential output signal of a differential amplifier $A_n$ of the last stage. Thus, the DC offset voltage $V_{osj}$ is superimposed on the differential input voltage to be supplied to the MOS differential pair composing the half-wave rectifier $4_j$.

Active loads $5_1$ to $5_{n+1}$ are connected to differential output lines of half-wave rectifiers $4_1$ to $4_{n+1}$, respectively, for outputting electric current signals based on the difference of differential output currents from corresponding half-wave rectifiers $4_1$ to $4_{n+1}$. The j-th active load $5_j$ comprises a current mirror circuit consisting of two P channel MOS transistors (PMOS transistors) $M3_j$, $M4_j$, and a capacitor $C_{oj}$ which serves for smoothing output signals of the half-wave rectifier $4_j$. Drains of transistors $M3_j$, $M4_j$ are connected in common to the voltage source $V_{DD}$, and gates of transistors $M3_j$, $M4_j$ are connected in common to a source of transistor $M3_j$. Sources of transistors $M3_j$, $M4_j$ are connected to differential output pair of the corresponding half-wave rectifier $4_j$ respectively. The capacitor $C_{oj}$ is placed between sources of transistor $M3_j$, $M4_j$ and the source of the other transistor $M4_j$ outputs a current $\Delta I_j$ corresponding to the difference between a pair of output currents of the half-wave rectifier $4_j$, the current representing an output of the active load $5_j$.

The adder 3 comprises a current mirror circuit composed of a pair of PMOS transistors M51, M52 and resistance $R_{RSSI}$ which serves as a load on the current mirror circuit. The adder 3 is designed to output a voltage $V_{RSSI}$ which corresponds to the sum of output currents $\Delta I_1$ to $\Delta I_{n+1}$ from active loads $5_1$ to $5_{n+1}$. The output voltage $V_{RSSI}$ represents the output of the logarithmic amplifying circuit. Drains of transistors M51, M52 are connected in common to a power source of voltage $V_{DD}$, and gates of transistors M51, M52 are connected in common to the source of one transistor M51. Outputs from active loads $5_1$ to $5_{n+1}$ are also connected in common to the source of the transistor M51. The source of the other transistor M52 is grounded through the resistance $R_{RSSI}$ and the source voltage of this transistor M52 represents the output voltage $V_{RSSI}$ of the logarithmic amplifying circuit.

Being constructed in this way, output signals from half-wave rectifiers $4_1$ to $4_{n+1}$ are smoothed by capacitors $C_{o1}$ to $C_{o(n+1)}$ and outputted as electric current signals respectively, then synthesized and converted by the adder 3 to a voltage signal to be finally outputted as a logarithmic signal.

The operation principle of the MOS half-wave rectifier will next be described to show that a logarithmic amplifying circuit can be realized according to the above construction.

Figure 4A:
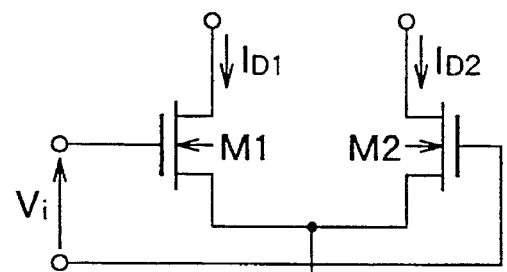
FIG. 4A is a circuit diagram showing the structure of a MOS coordinate differential pair.

FIG. 4A is a circuit diagram of a MOS coordinate differential pair which does not include an offset voltage source for a gate voltage. This differential pair is composed of a pair of NMOS transistors M1, M2, and a current source $I_O$ for a tail current commonly provided for transistors M1, M2. If a differential voltage $V_i$ is applied between gates of transistors M1, M2, and resulted drain currents of transistors M1, M2 are represented as $I_{D1}$, $I_{D2}$, respectively, then the differential output current $\Delta I_D$, i.e., the difference between the drain currents is expressed by equation (1).

$$\Delta I_D = I_{D1} - I_{D2} \qquad (1)$$

$$= \begin{cases} \beta V_i \sqrt{\dfrac{2I_o}{\beta} - V_i^2} & \left(|V_i| \leq \sqrt{\dfrac{I_o}{\beta}}\right) \\ I_o \operatorname{sgn}(V_i) & \left(|V_i| \geq \sqrt{\dfrac{I_o}{\beta}}\right) \end{cases}$$

where $\beta$ is a transconductance parameter of the transistor to be expressed by the following equation (2).

$$\beta = \mu \left(\dfrac{C_{ox}}{2}\right)\left(\dfrac{W}{L}\right) \qquad (2)$$

where $\mu$ is the effective mobility of a carrier, $C_{ox}$ is a capacity of a gate oxide film per unit area, W is the gate width, and L is the gate length.

Figure 4B:
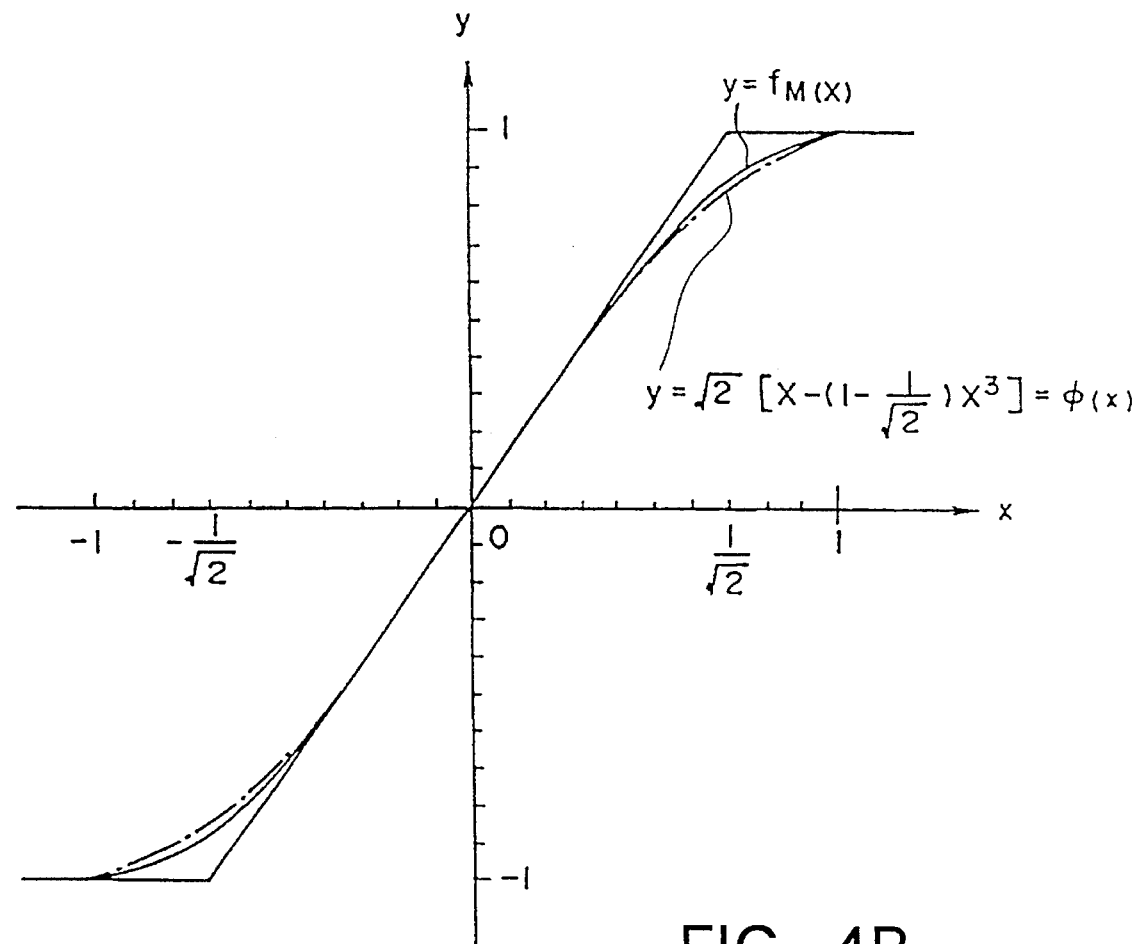
FIG. 4B is a diagram showing a characteristic of a normalized current of the MOS coordinate differential pair shown in FIG. 4A and a characteristic of an approximate expression of the above normalized current.

Therefore, if the characteristic of the differential output current of the MOS coordinate differential pair is normalized and denoted as $f_M(x)$, the characteristic of the normalized output current of the MOS coordinate differential pair is expressed as shown in FIG. 4B. Here, x is a normalized input voltage and $f_M(x)$ is given by equation (3).

$$f_M(x) = \frac{\Delta I_D}{I_O} \qquad (3)$$

$$x = \frac{V_i}{\sqrt{I_O/\beta}}$$

Accordingly, when a DC offset voltage $V_{os}$ is superimposed on the input voltage to be supplied to the MOS coordinate differential pair, the characteristic curve of the normalized output current shown in FIG. 4B shifts by the offset voltage $V_{os}$ in the direction of the axis of the input voltage. If the DC offset voltage $V_{os}$ is expressed as shown in equation (4), $$V_{os} = \frac{V_i}{\sqrt{I_O/2\beta}} \qquad (4)$$

it is possible to modify the MOS coordinate differential pair to be almost equivalent to a half-wave rectifier by superimposing the DC offset voltage $V_{os}$. The half-wave rectifier thus obtained is each of the half-wave rectifiers $4_1$ to $4_{n+1}$ shown in FIG. 3.

By summing up output currents of thus obtained half-wave rectifiers $4_1$ to $4_{n+1}$ and converting them into a voltage, as shown in FIG. 3, an output voltage $V_{RSSI}$ which is approximate to the logarithmic value of the input voltage $V_{IN}$ can be obtained. The voltage $V_{RSSI}$ is given by equation (5).

$$V_{RSSI} = R_{RSSI} I_{RSSI} \qquad (5)$$

In this case, the logarithmic input dynamic range of each half-wave rectifier is 8 dB, and the logarithmic accuracy is secured for each stage for the range of about 8 dB. Therefore, in order to secure the logarithmic accuracy of the whole logarithmic amplifying circuit, it is necessary and sufficient to arrange the gain of each of differential amplifiers $A_1$ to $A_n$ to about 8 dB. Since this circuit requires one constant current source for each half-wave rectifier, it is possible to reduce the number of constant current sources used in a logarithmic amplifying circuit compared with a case employing the conventional circuit described above.

In the above example, inasmuch as each half-wave rectifier is composed of one MOS coordinate differential pair, the gain of a differential amplifier of each stage is arranged to about 8 dB. However, with a general differential amplifier of a standard structure, it is easy to have a gain of about 20 dB or more. Therefore, if the logarithmic dynamic range per half-wave rectifier can be expanded, it becomes possible to reduce the number of differential amplifiers to be cascade-connected while maintaining the total logarithmic dynamic range as a logarithmic amplifying circuit.

Figure 5:
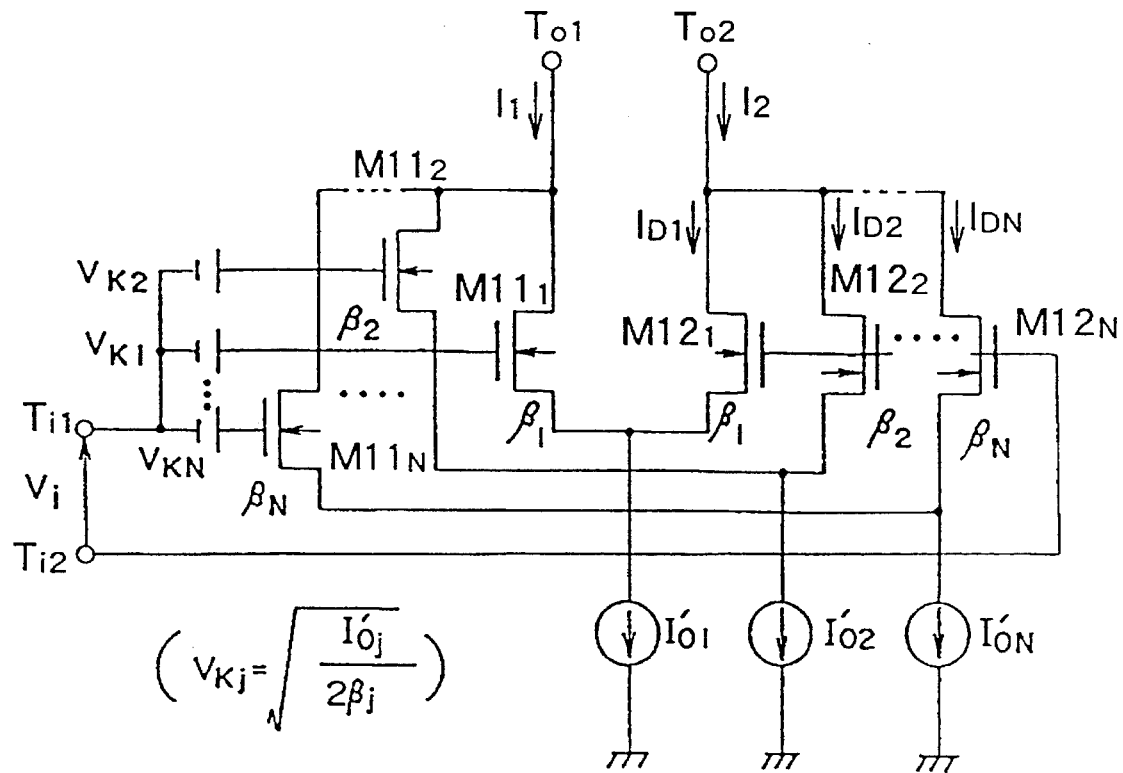
FIG. 5 is a circuit diagram showing the structure of a pseudologarithmic half-wave rectifier which employs MOS transistors and DC offset voltage sources.

The logarithmic dynamic range per half-wave rectifier can be expanded by providing a plurality of parallel-connected MOS differential pairs for every half-wave rectifier, each differential pair having a different characteristic and operational conditions. FIG. 5 shows the structure of a pseudologarithmic half-wave rectifier composed of parallel-connected N pairs ($N \geq 2$) of MOS differential pairs. The pseudologarithmic half-wave rectifier comprises a differential input terminal pair $T_{i1}$, $T_{i2}$ provided common to a differential pair and a differential output terminal pair $T_{o1}$, $T_{o2}$ similarly provided common to the differential pair. A constant current source for the tail current and an offset voltage source for superimposing a DC offset voltage on the difference input voltage are provided for every differential pair. Specifically, the j-th differential pair is composed of two MOS transistors $M11_j$, $M12_j$ with a transconductance parameter $\beta$, and sources of these MOS transistors $M11_j$, $M12_j$ are connected in common and grounded through the tail current source $I_{Oj}'$. The gate of one transistor $M11_j$ is connected to one input terminal $T_{i1}$ through the offset voltage source $V_{kj}$, and the gate of the other transistor $M12_j$ is directly connected to the other input terminal $T_{i2}$, while drains of transistors $M11_j$, $M12_j$ are connected to output terminals $T_{o1}$, $T_{o2}$, respectively.

When it is structured in this way, the DC offset voltage $V_{kj}$ required for the j-th differential pair in order to be a half-wave rectifier is given by equation (6).

$$V_{kj} = \sqrt{\frac{I_{Oj}}{\beta_i}} \qquad (6)$$

The short-circuit transconductance $g_{mj}$ of each MOS transistor composing the j-th differential pair is given by equation (7).

$$g_{mj} = \sqrt{2\beta_i I_{Oj}} \qquad (7)$$

The pseudologarithmic characteristic of the parallel-connected differential pairs can be obtained by arranging transconductance $g_m$ of MOS transistors in such a manner that $g_m$ varies in accordance with the geometric progression as shown in equation (8).

$$\frac{\beta_1 I_{O1}}{\beta_2 I_{O2}} = \frac{\beta_2 I_{O2}}{\beta_3 I_{O3}} = \ldots \qquad (8)$$

Figure 6:
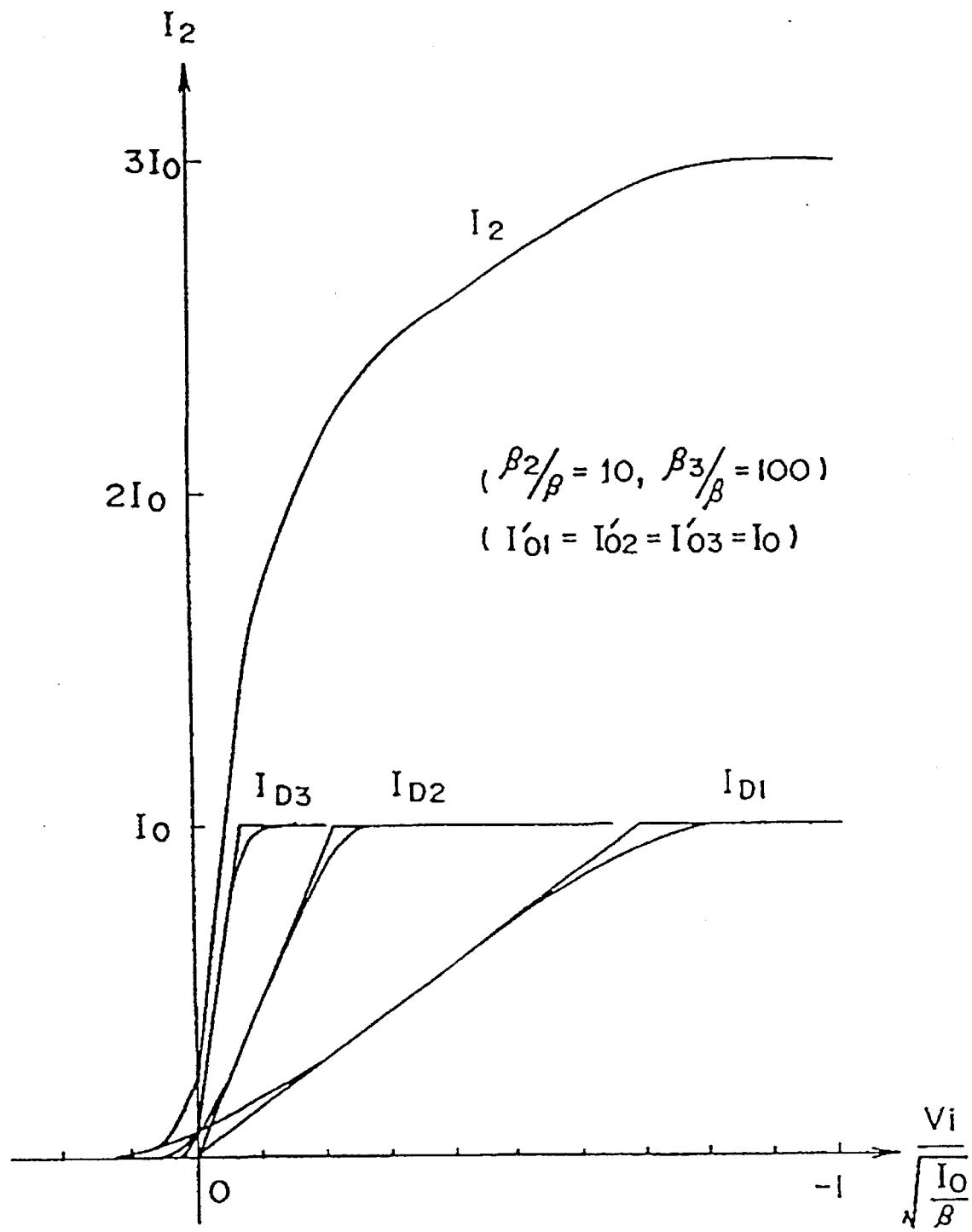
FIG. 6 is a diagram showing a characteristic of the output voltage of the half-wave rectifier shown in FIG. 5.
Figure 7:
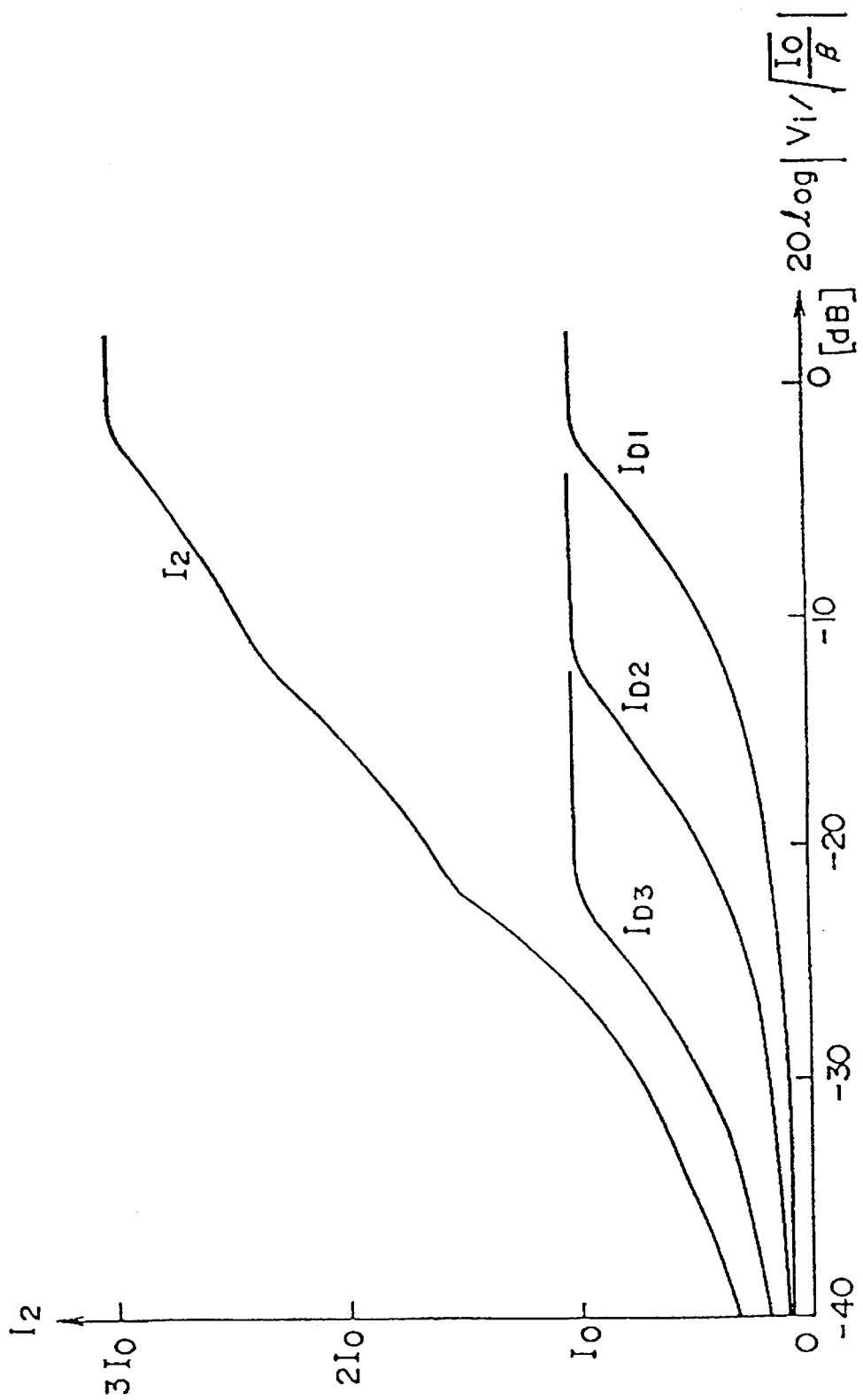
FIG. 7 is a diagram showing, in a logarithmic scale, a characteristic of the output voltage of the half-wave rectifier shown in FIG. 5.

FIG. 6 is a diagram showing a characteristic of output currents of the pseudologarithmic half-wave rectifier shown in FIG. 5 when the number of differential pairs is 3 (N=3), $\beta_2/\beta_1 = \beta_3/\beta_2 = 10$, and $I_{O1}' = I_{O2}' = I_{O3}' = I_O$. The vertical axis gives the one of differential output currents, and the horizontal axis gives the normalized input voltages. In the diagram, drain currents of MOS transistors $M12_1$, $M12_2$, $M12_3$ are represented as $I_{D1}$, $I_{D2}$, $I_{D3}$ respectively, and a combined current of these drain currents is represented as $I_2$. FIG. 7 represents a characteristic of the output current when the input voltage is given in a dB scale. From FIGS. 6 and 7, it is understood that the logarithmic input dynamic range of a half-wave rectifier is expanded by connecting MOS differential pairs in parallel. Therefore, by using the pseudologarithmic half-wave rectifier shown in FIG. 5 in place of half-wave rectifiers $4_1$ to $4_{n+1}$ shown in FIG. 3, the number of cascade-connected differential amplifiers can be reduced while maintaining the logarithmic input dynamic range as a logarithmic amplifying circuit.

Figure 8:
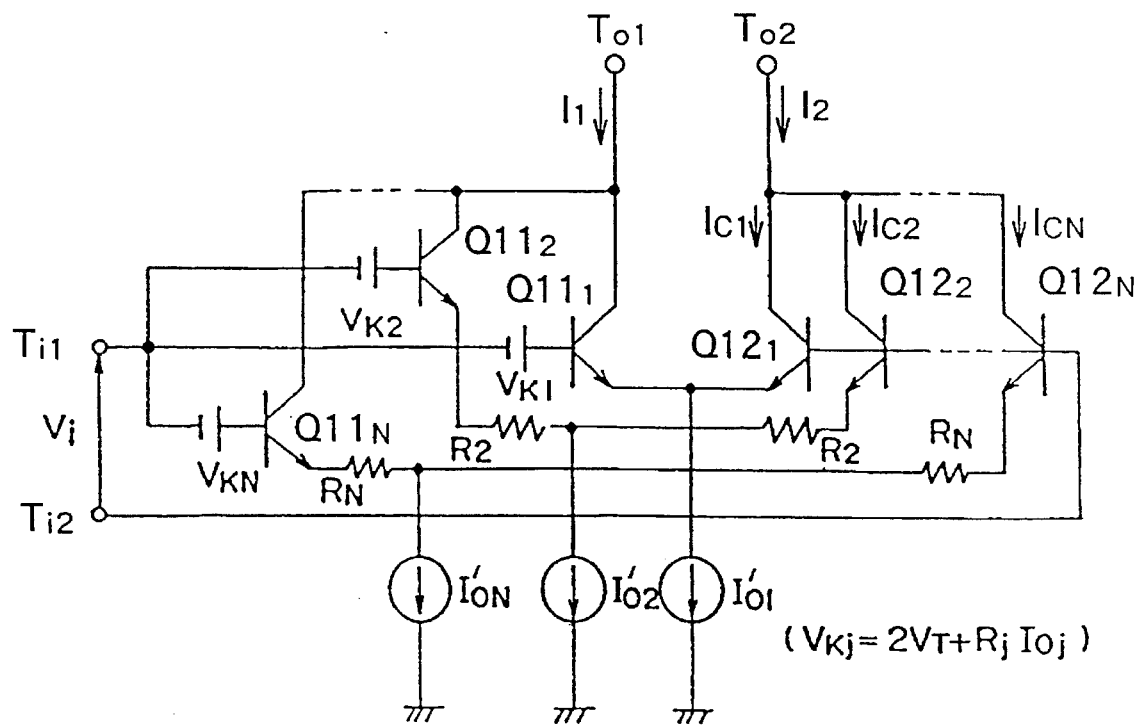
FIG. 8 is a circuit diagram showing the structure of a pseudologarithmic half-wave rectifier which employs bipolar transistors and DC offset voltage sources.

A pseudologarithmic half-wave rectifier composed of parallel-connected differential pairs can also be realized by using bipolar transistors. FIG. 8 is a circuit diagram showing the structure of a pseudologarithmic half-wave rectifier which employs a plurality of differential pairs each using bipolar transistors. The pseudologarithmic half-wave rectifier comprises N pairs of bipolar differential pairs. It is composed of NPN transistors $Q11_1$, $Q12_1$, $Q11_2$, ..., $Q11_N$, $Q12_N$ instead of MOS transistors $M11_1$, $M12_1$, $M11_2$, ..., $M11_N$, $M12_N$ of the MOS pseudologarithmic half-wave rectifier shown in FIG. 5. However, in order to change the input-output characteristic of each differential pair, emitter resistance is inserted in the circuit for changing the emitter degeneration value (product of emitter resistance and tail current). In other word, between the emitter of each transistor $M11_j$, $M12_j$ of the j-th differential pair and its tail current source $I_{oj}'$, resistance $R_j$ of the identical value is inserted, however, the first differential pair has no resistance inserted because $R_1$ is set to 0.

In order to obtain, with the parallel-connected differential pairs on which DC offset voltage are impressed, a half-wave rectification characteristic, it is necessary that the relation given in equation (9) is established between the emitter degeneration value $R_j \cdot I_{oj}$ of the j-th differential pair and the DC offset voltage $V_{kj}$ to be applied on the j-th differential pair.

$$V_{kj} = 2V_T + R_j I_{oi} \quad (9)$$

where $V_T$ represents a thermovoltage which is expressed as $V_T = kT/q$. Here, k represents a Boltzmann's constant, T an absolute temperature, and q the unit electron charge. In order to produce a half-wave rectifier structured as shown in FIG. 8 while having a pseudologarithmic characteristic, it is necessary to change the input voltage range of each parallel-connected differential pair in accordance with an inverse logarithmic function as shown in equation (10), i.e., an exponential function.

$$\frac{2V_T + R_2 I_{o2}}{2V_T} = \frac{2V_T + R_3 I_{o3}}{2V_T + R_2 I_{o2}} = \ldots \quad (10)$$

In other words, the relation between values of the short-circuit transconductance $g_m$ of parallel-connected differential pairs is given by equation (11).

$$\frac{g_{m1}}{g_{m2}} = \frac{g_{m2}}{g_{m3}} = \ldots \quad (11)$$

Figure 9:
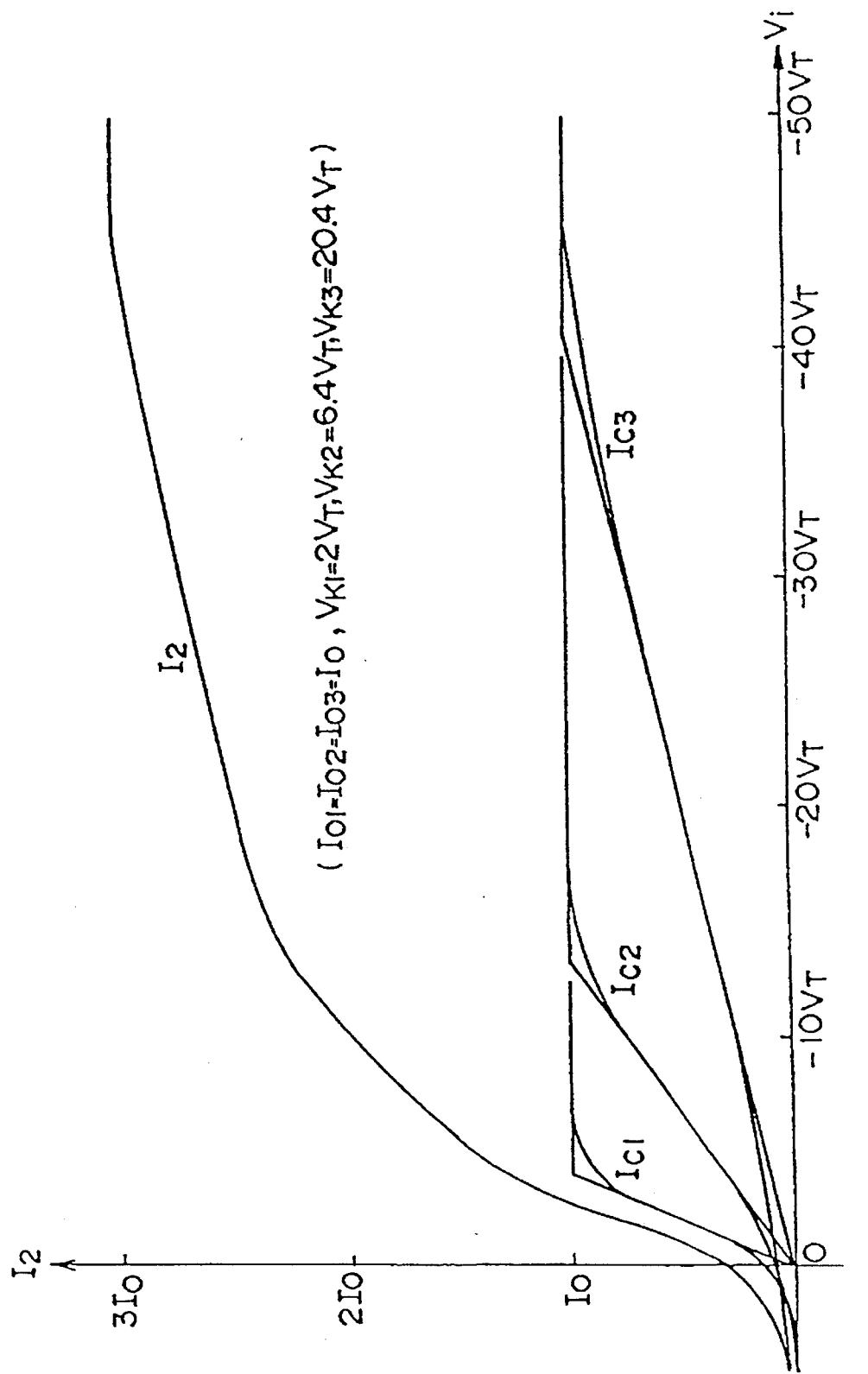
FIG. 9 is a diagram showing a characteristic of the output voltage of the half-wave rectifier shown in FIG. 8.
Figure 10:
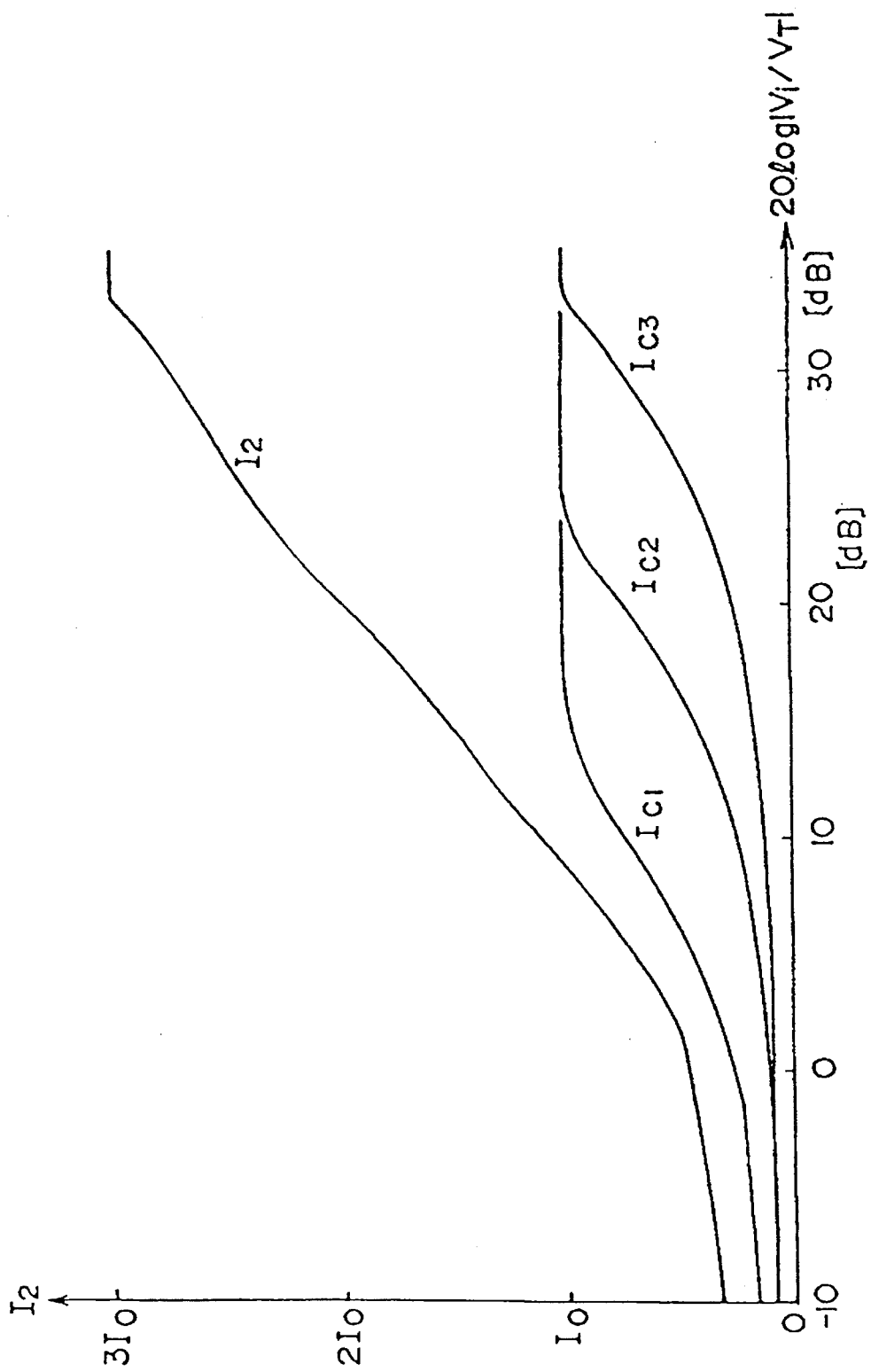
FIG. 10 is a diagram showing, in a logarithmic scale, a characteristic of the output voltage of the half-wave rectifier shown in FIG. 8.

FIG. 9 is a diagram showing a characteristic of the output current of the pseudologarithmic half-wave rectifier shown in FIG. 8 when the number of differential pairs is 3 (N=3), $I_{o1}'=I_{o2}'=I_{o3}'=I_o$. $V_{k1}=2V_T$, $V_{k2}=6.4V_T$, and $V_{k3}=20.4V_T$. In this diagram, the vertical axis gives the output currents, and the horizontal axis gives the normalized input voltage. In the diagram, collector currents of bipolar transistors $Q12_1$, $Q12_2$, $Q12_3$ are represented as $I_{C1}$, $I_{C2}$, $I_{C3}$ respectively, and a combined current of these collector currents is represented as $I_2$. FIG. 10 represents characteristics of the output currents when the input voltage is given in a dB scale. From FIGS. 9 and 10, it is understood that the logarithmic input dynamic range of a half-wave rectifier is expanded by connecting bipolar differential pairs in parallel. Therefore, by using the pseudologarithmic half-wave rectifier shown in FIG. 8 in place of half-wave rectifiers $4_1$ to $4_{n+1}$ shown in FIG. 3, the number of cascade-connected differential amplifiers can be reduced while maintaining the logarithmic input dynamic range as a logarithmic amplifying circuit.

Figure 11:
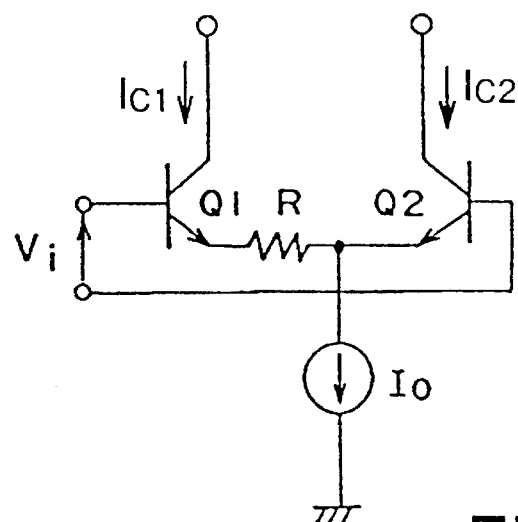
FIG. 11 is a circuit diagram showing a bipolar unbalanced differential pair constituted according to emitter degeneration.

When the bipolar process is applied, by arranging the value of the emitter degeneration within the differential pair so that it may be unbalanced, it also becomes possible to superimpose a DC offset voltage on the differential input voltage without providing an offset voltage source. Unbalanced emitter degeneration is achieved by inserting the emitter resistance only to one transistor of the bipolar differential pair. FIG. 11 is a circuit diagram showing a half-wave rectifier composed of a bipolar unbalanced differential pair. This half-wave rectifier can be used in the logarithmic amplifying circuit shown in FIG. 3 in place of each of half-wave rectifiers $4_1$ to $4_{n+1}$.

In FIG. 11, there are provided two bipolar transistors $Q_1$, $Q_2$ of almost similar characteristic. Gates of each transistor $Q_1$, $Q_2$ are connected to differential input terminals $T_{i1}$, $T_{i2}$, respectively, and collectors of each transistor $Q_1$, $Q_2$ are connected to differential output terminals $T_{o1}$, $T_{o2}$, respectively. Resistance R is inserted only in the emitter of one transistor $Q_1$, the other end of the resistance R is grounded through a constant current source for a tail current $I_O$. The emitter of a second transistor $Q_2$ is connected to the node between resistance R and the constant current source. If the base-to-emitter voltages of the first and second transistors $Q_1$, $Q_2$ are assumed as $V_{BE1}$, $V_{BE2}$, and collector currents thereof are assumed as $I_{C1}$, $I_{C2}$, equation (12) is established for a differential input voltage $V_i$.

$$V_i = V_{BE1} + \frac{RI_{C1}}{\alpha_F} - V_{BE2} \quad (12)$$

where $\alpha_F$ is the DC common-base current amplification factor. The equation (13) is established for $V_{BE1}$, $V_{BE2}$.

$$V_{BE1} = V_T \ln\left(\frac{I_{C1}}{I_{S1}}\right) \quad (13)$$

$$V_{BE2} = V_T \ln\left(\frac{I_{C2}}{I_{S2}}\right)$$

where $I_{S1}$, $I_{S2}$ are saturation currents of the bipolar transistors $Q_1$, $Q_2$. Now, it is assumed that equation (14) stands.

$$I_{S1} = I_{S2} \quad (14)$$

Since the circuit is driven by the tail current $I_O$, equation (15) is satisfied.

$$\frac{1}{\alpha_F}(I_{C1} + I_{C2}) = I_O \quad (15)$$

From the above equations (12) through (15), the following equation (16) is obtained.

$$V_i = V_T \ln\left(\frac{I_{C1}}{I_{C2}}\right) + \frac{RI_{C1}}{\alpha_F} \quad (16)$$

If $I_{c1} = I_{c2} = \alpha_F \cdot I_O/2$ is satisfied in equation (16), an input offset voltage $V_1$ is given by equation (17).

$$V_1 = \frac{RI_O}{2\alpha_F} \quad (17)$$

The equation (18) is obtained by differentiating equation (15) with respect to the collector current $I_{c1}$.

$$\frac{dV_i}{dI_{C1}} = \frac{V_T}{I_{C1}} + \frac{V_T}{\alpha_F I_O - I_{C1}} + \frac{R}{\alpha_F} \quad (18)$$

Therefore, when $V_i = V_1$ ($I_{c1} = I_{c2} = \alpha_F \cdot I_O/2$), the inclination is maximum. This inclination is given in equation (19). Since the tangent at the point with the maximum inclination $(V_1, \alpha_F \cdot I_O/2)$ passes the point $(-2V_T, 0)$, by applying a bias offset of $2V_T$ to the input signal, this bipolar unbalanced differential pair becomes almost equivalent to the half-wave rectifier. Accordingly, this half-wave rectifier can be used in place of each of half-wave rectifiers $4_1$ to $4_{n+1}$ shown in FIG. 3.

$$\left.\frac{dI_{C1}}{dV_i}\right|_{V_i = V_1} = \frac{\alpha_F I_O}{4V_T + RI_O} \quad (19)$$

Figure 12:
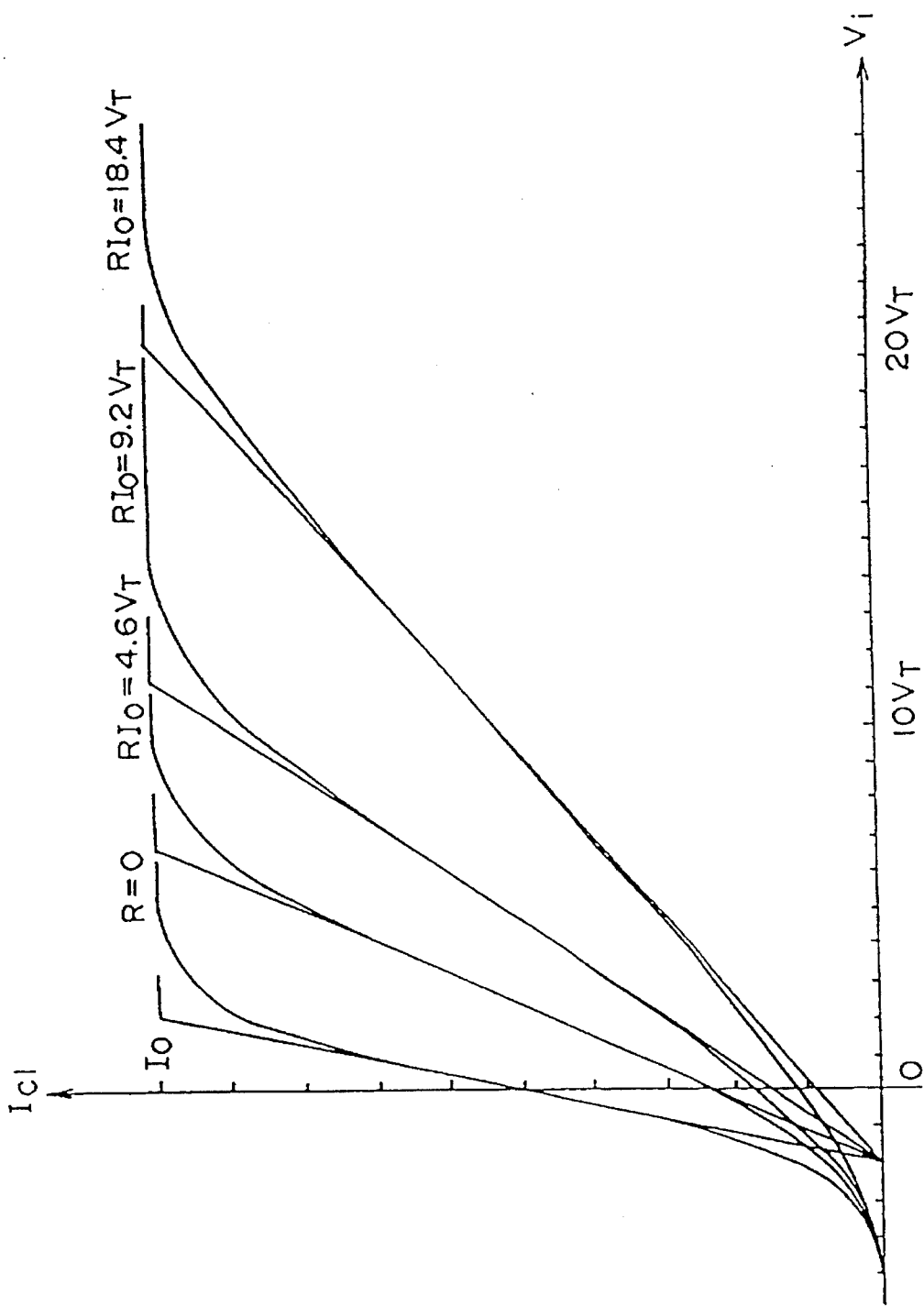
FIG. 12 is a diagram showing a characteristic of the output current of the bipolar unbalanced differential pair according to the emitter degeneration.

FIG. 12 shows a characteristic of the output currents of bipolar unbalanced differential pairs with various emitter degeneration values structured as above.

Figure 13:
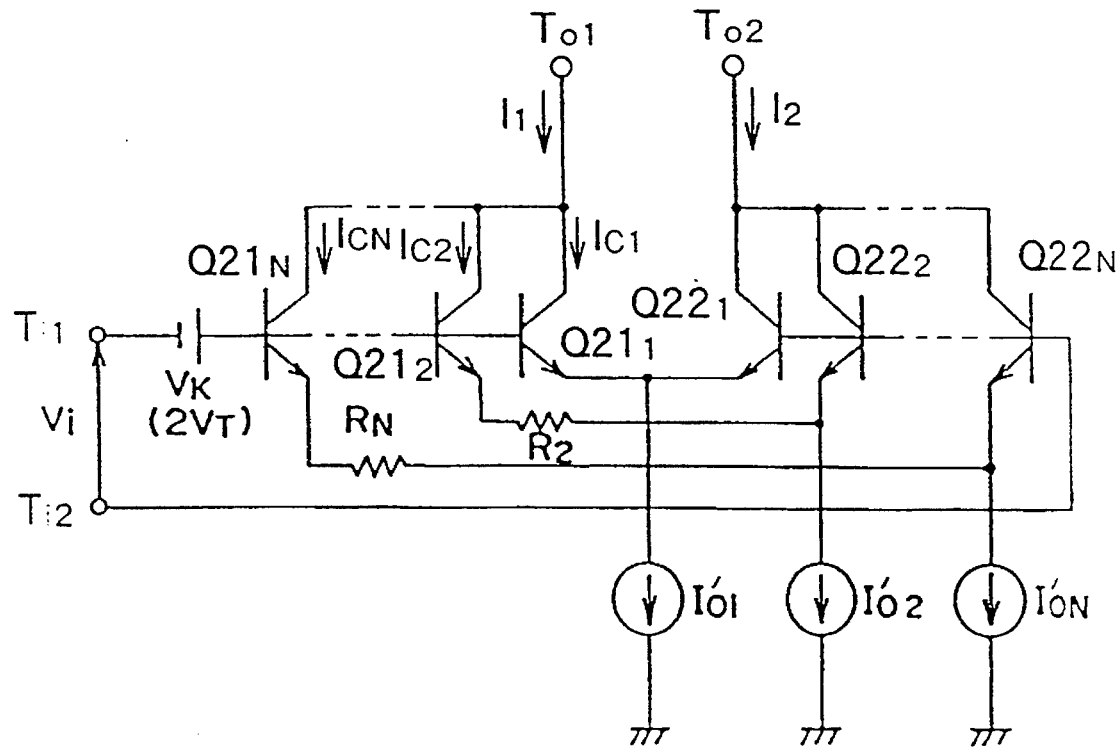
FIG. 13 is a circuit diagram showing a structure of a pseudo logarithmic half-wave rectifier which employs a DC offset voltage source and bipolar unbalanced differential pairs according to the emitter degeneration.

As described above with reference to FIG. 5 or 8, the logarithmic input dynamic range can be expanded by means of a plurality of parallel-connected bipolar unbalanced differential pairs. FIG. 13 is a circuit diagram showing the structure of a pseudologarithmic half-wave rectifier composed of a plurality of bipolar unbalanced differential pairs connected in parallel. The pseudologarithmic half-wave rectifier includes a pair of differential input terminals $T_{i1}$, $T_{i2}$, a pair of differential output terminals $T_{o1}$, $T_{o2}$, and one offset voltage source. These terminals and offset voltage source are commonly provided to all the differential pairs. The offset voltage $V_k$ to be generated by the offset voltage source can be set to $2V_T$ for any differential pair regardless of the position of the differential pair. The j-th differential pair is composed of two bipolar transistors $Q21_j$, $Q22_j$, an emitter resistance $R_j$ inserted to one transistor $Q21_j$, and a tail current source $I_{oj}'$. The base of one transistor $Q21_j$ is connected to one input terminal $T_{i1}$ through the offset voltage source $V_k$, and the base of the other transistor $Q22_j$ is directly connected to the other input terminal $T_{i2}$. Collectors of transistors $Q21_j$, $Q22_j$ are connected to output terminals $T_{o1}$, $T_{o2}$, respectively. However, in the example illustrated, only the first differential pair is a balanced differential pair because of its emitter resistance $R_1$ which is zero.

This pseudologarithmic half-wave rectifier is different from the pseudologarithmic half-wave rectifier shown in FIG. 8 in that the former rectifier has an unbalanced bipolar differential pair and has only one offset voltage source. Therefore, by comparing equation (9) with the above bias offset voltage $V_k=2V_T$, it can be understood that the voltage $V_k$ of the offset voltage source required for approximating the characteristic of an unbalanced differential pair to a half-wave rectifying characteristic is less than the voltage shown in FIG. 8 by $R_j \cdot I_{oj}$. Further, an input range of the operational voltage as a half-wave rectifier is narrowed by the range corresponding to the value of $R_j \cdot I_{oj}$.

Figure 14:
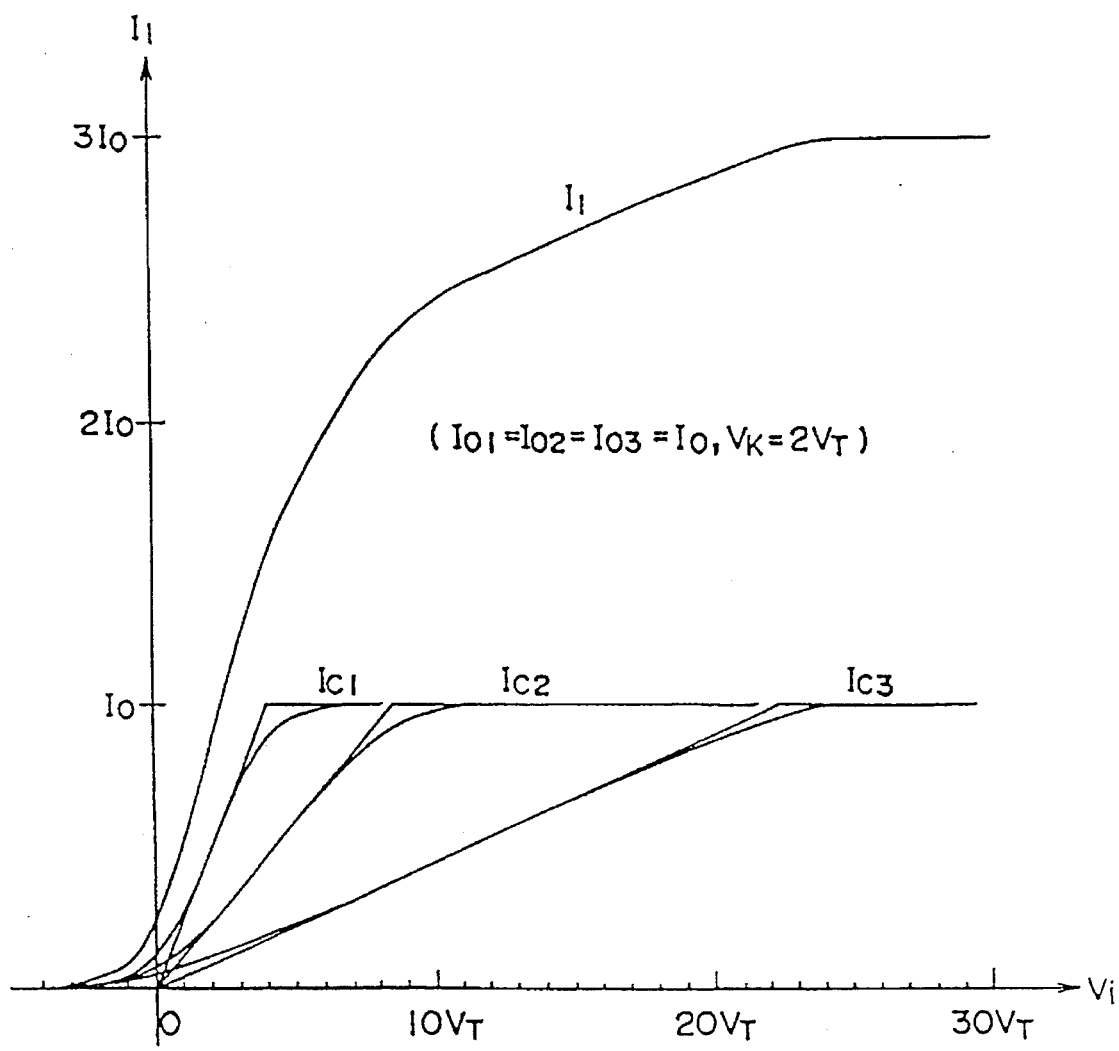
FIG. 14 is a diagram showing a characteristic of the output voltage of the half-wave rectifier shown in FIG. 13.
Figure 15:
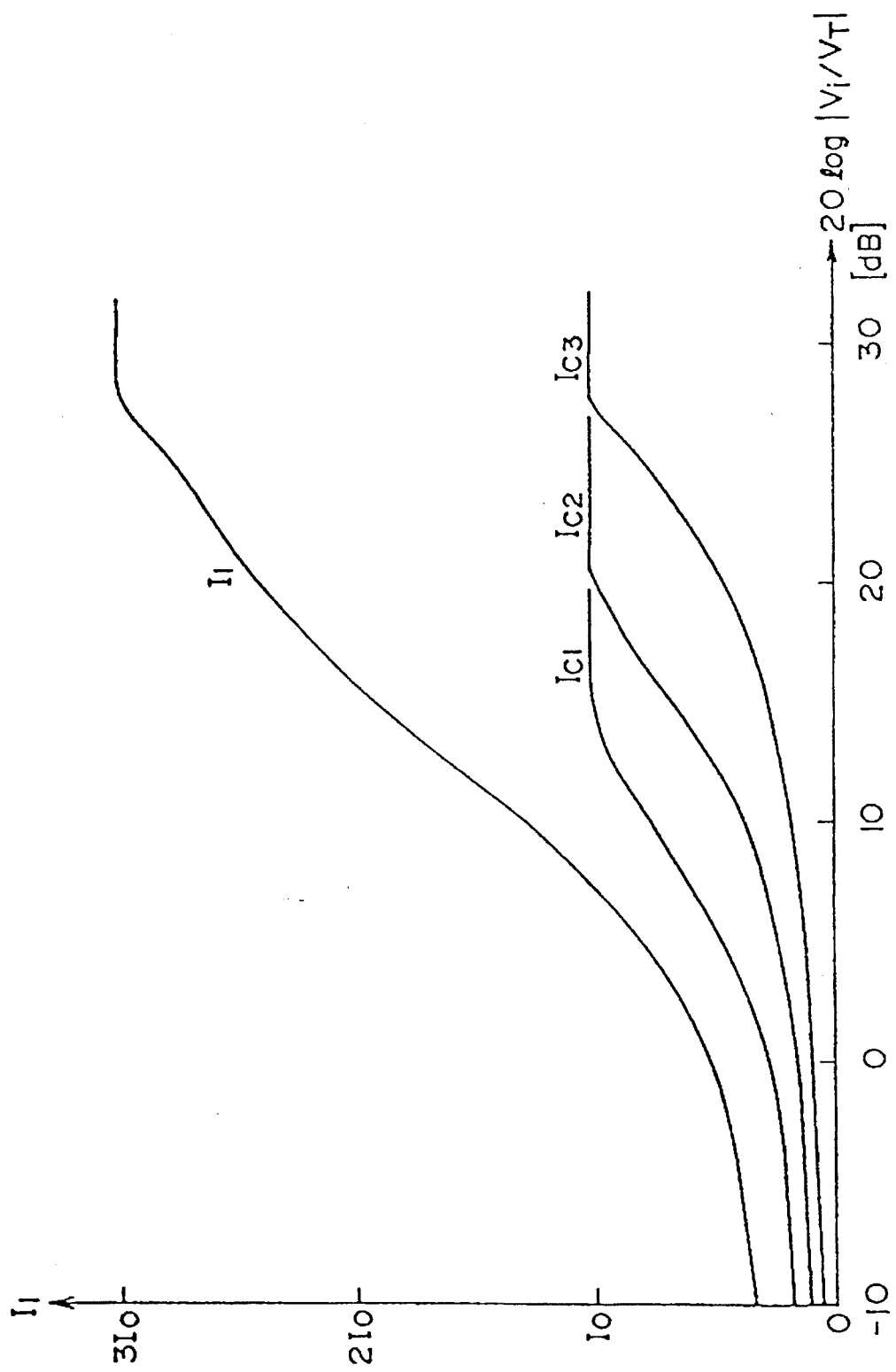
FIG. 15 is a diagram showing, in a logarithmic scale, a characteristic of the output voltage of the half-wave rectifier shown in FIG. 13.

FIG. 14 is a diagram showing a characteristic of the output current of the pseudologarithmic half-wave rectifier shown in FIG. 13 when the number of unbalanced differential pairs is 3 (N=3), $I_{O1}'=I_{O2}'=I_{O3}'=I_O$, and $V_k=2\,V_T$. In this diagram, the vertical axis gives the output currents and the horizontal axis gives the input voltages. In the diagram, collector currents of bipolar transistors $Q21_1$, $Q21_2$, $Q21_3$ are represented as $I_{C1}$, $I_{C2}$, $I_{C3}$ respectively, and a combined current of these collector currents is represented as $I_1$. FIG. 15 represents a characteristic of the output current when the input voltage is given in a dB scale. From FIGS. 14 and 15, it is understood that the logarithmic input dynamic range of a half-wave rectifier is expanded by connecting a bipolar unbalanced differential pair in parallel. Therefore, by using the pseudologarithmic half-wave rectifier shown in FIG. 13 in place of half-wave rectifiers $4_1$ to $4_{n+1}$ shown in FIG. 3, the number of cascade-connected differential amplifiers can be reduced while maintaining the logarithmic input dynamic range as a logarithmic amplifying circuit.

A preferable embodiment of the present invention has been described above with reference to examples in which logarithmic amplifying circuits are composed of half-wave rectifiers, however, the logarithmic amplifying circuit can be composed by using full-wave rectifiers in place of the half-wave rectifiers. It is possible to construct a full-wave rectifier by cross-coupling an even number of differential pairs. Each pair of every two differential pairs has identical characteristic and a DC offset voltage is applied on each pair. The polarity of the DC offset voltage is alternately changed for every two pairs.

It will be described below that a characteristic of the full-wave rectifier thus structured can be approximate to a square-law characteristic.

The case according to the MOS process will first be described. A normalized differential output current $f_M(x)$ (refer to equation (3)) of a coordinate differential pair, i.e., $\Delta I_D/\Delta I_{O1}$ can be obtained approximately by equation (20).

$$f_M(x) = \begin{cases} \sqrt{2} \times \sqrt{1 - x^2/2} = 1.414x - 0.414x^3 & (|x| \leq 1) \\ \text{sgn}(x) & (|x| \geq 1) \end{cases} \quad (20)$$

In equation (20), if it is calculated to the third degree of x, the approximation error of the solution is 3% or less. Here, a function $\Phi(V_i)$ which depends on the input voltage is defined as shown in equation (21).

$$\Phi(V_i) = \begin{cases} \sqrt{2\beta_i I_{0i}}\, V_i \left\{ 1 - \left(1 - \dfrac{1}{\sqrt{2}}\right) \dfrac{\beta_i}{I_{0i}} V_i^2 \right\} & \left(|V_i| \leq \sqrt{\dfrac{I_{0i}}{\beta_i}}\right) \\ I_{0i}\,\text{sgn}(V_i) & \left(|V_i| \geq \sqrt{\dfrac{I_{0i}}{\beta_i}}\right) \end{cases} \quad (21)$$

The above equation (21) can be approximated to equation (22).

$$\Phi(V_i) \doteq \Delta I_D \quad (22)$$

When equation (23) is satisfied, equation (1) coincides with equation (21).

$$V_i = 0, |V_i| \geq \sqrt{I_{0i}/\beta_i} \quad (23)$$

In the above FIG. 4B, a chain line expresses an approximate characteristic according to equation (20). It is nearly coincident with the curve of $\Delta I_D$ of a solid line with the error within 3%. Consequently, equation (19) provides good approximation to the differential output current. Further, by normalizing the function $\Phi(V_i)$ given by equation (20), equation (24) is obtained.

$$\phi(x) = \dfrac{\Phi(x/\sqrt{I_0/\beta})}{I_0} = \begin{cases} \sqrt{2} \times \left\{ 1 - \left(1 - \dfrac{1}{\sqrt{2}}\right) x^2 \right\} = 1.414x - 0.414x^3 & (|x| \leq 1) \\ \text{sgn}(x) & (|x| \geq 1) \end{cases} \quad (24)$$

Figure 16:
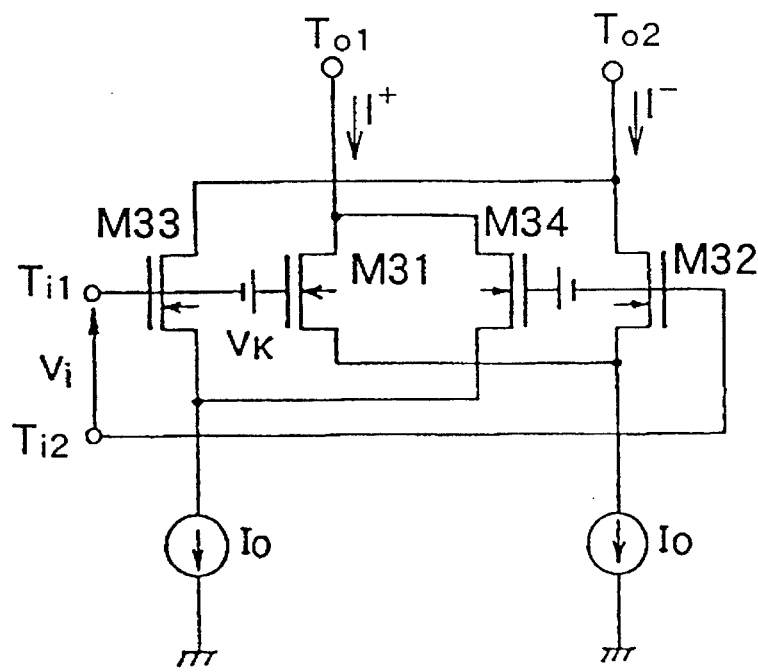
FIG. 16 is a circuit diagram showing the structure of a full-wave rectifier which employs MOS transistors and DC offset voltage sources.

FIG. 16 is a circuit diagram showing the structure of a pseudologarithmic full-wave rectifier composed of two pairs of MOS coordinate differential pairs and two offset voltage source. A first differential pair is composed of MOS transistors M31, M32, and a second differential pair is composed of MOS transistors M33, M34. A constant current source is provided for each differential pair to cause a tail current $I_O$ of the same strength to flow. Transistors M31 to M34 are each of the same characteristic. Drains of transistors M31, M34 are connected to one output terminal $T_{o1}$, and drains of the remaining transistors M32, M33 are connected to the other output terminal $T_{o2}$. The gate of the MOS transistor 31 is connected to one input terminal $T_{i1}$ through the offset voltage source with a voltage $V_k$. At this time, the polarity of the offset voltage source $V_k$ is positive on the gate side of the transistor 31. The gate of the transistor M33 is directly connected to the input terminal $T_{i1}$. On the other hand, the gate of the transistor M32 is directly connected to the other input terminal $T_{i2}$, and the gate of the transistor M34 is also connected to the other input terminal $T_{i2}$ through the other offset voltage source with the voltage $V_k$. Here, the polarity of the offset voltage source $V_k$ is positive on the gate side of the transistor 34. Consequently, with reference to the differential input voltage $V_i$, DC offset voltages of mutually reverse polarity are applied to the input voltage of each differential pair.

The differential output current $\Delta I_{OSM}$ of two source-coupled differential pairs shown in FIG. 16 is given by equation (25) as follows.

$$\Delta I_{OSM} = I^+ - I^- = (I_{D1} + I_{D4}) - (I_{D2} + I_{D3}) \qquad (25)$$

$$= \begin{cases} \beta \left\{ (V_i - V_k)\sqrt{\dfrac{2I_O}{\beta} - (V_i - V_k)^2} - (V_i + V_k)\sqrt{\dfrac{2I_O}{\beta} - (V_i + V_k)^2} \right\} \\ \qquad \left( |V_i| \le \sqrt{\dfrac{I_O}{\beta}} - V_k \right) \\ I_O - \beta(|V_i| - V_k)\sqrt{\dfrac{2I_O}{\beta} - (|V_i| - V_k)^2} \\ \qquad \left( \sqrt{\dfrac{I_O}{\beta}} - V_k \le |V_i| \le \sqrt{\dfrac{I_O}{\beta}} + V_k \right) \\ 0 \qquad \left( |V_i| \ge \sqrt{\dfrac{I_O}{\beta}} + V_k \right) \end{cases}$$

By normalizing equation (25), equation (26) is obtained.

$$p_{M(b)}(x) = f_M(x - b) - f_M(x + b) \qquad (26)$$

$$= \begin{cases} \sqrt{2} \left\{ (x - b)\sqrt{1 - \dfrac{1}{2}(x - b)^2} - (x + b)\sqrt{1 - \dfrac{1}{2}(x + b)^2} \right\} \\ \qquad (|x| \le 1 - b) \\ 1 - \sqrt{2}(|x| - b)\sqrt{1 - \dfrac{1}{2}(|x| - b)^2} \\ \qquad (1 - b \le |x| \le 1 + b) \\ 0 \qquad (|x| \ge 1 + b) \end{cases}$$

where b is given by equation (27).

$$b = \dfrac{V_k}{\sqrt{I_O/\beta}} \qquad (27)$$

Further, equation (28) is obtained when equation (25) is rewritten according to the approximate expression defined by equation (21).

$$\Delta I_{OSM} \approx \Phi(V_i - V_k) - \Phi(V_i + V_k) \qquad (28)$$

$$= \begin{cases} -2\sqrt{2\beta I_O}\ V_k \left\{ 1 - \left(1 - \dfrac{1}{\sqrt{2}}\right)\dfrac{I_O}{\beta}(V_k^2 + 3V_i^2) \right\} \\ \qquad \left( |V_i| \le \sqrt{\dfrac{I_O}{\beta}} - V_k \right) \\ -\left[ I_O - \sqrt{2\beta I_O} \left\{ |V_i| - V_k - \left(1 - \dfrac{1}{\sqrt{2}}\right)\dfrac{I_O}{\beta}(|V_i| - V_k)^3 \right\} \right] \\ \qquad \left( \sqrt{\dfrac{I_O}{\beta}} - V_k \le |V_i| \le \sqrt{\dfrac{I_O}{\beta}} + V_k \right) \\ 0 \qquad \left( |V_i| \ge \sqrt{\dfrac{I_O}{\beta}} + V_k \right) \end{cases}$$

Therefore, if the input voltage range is limited according to expression (29), the circuit shown in FIG. 16 becomes nearly equivalent to the square-law circuit.

$$|V_i| \le \sqrt{\dfrac{I_O}{\beta}} - V_k \qquad (29)$$

Figure 17:
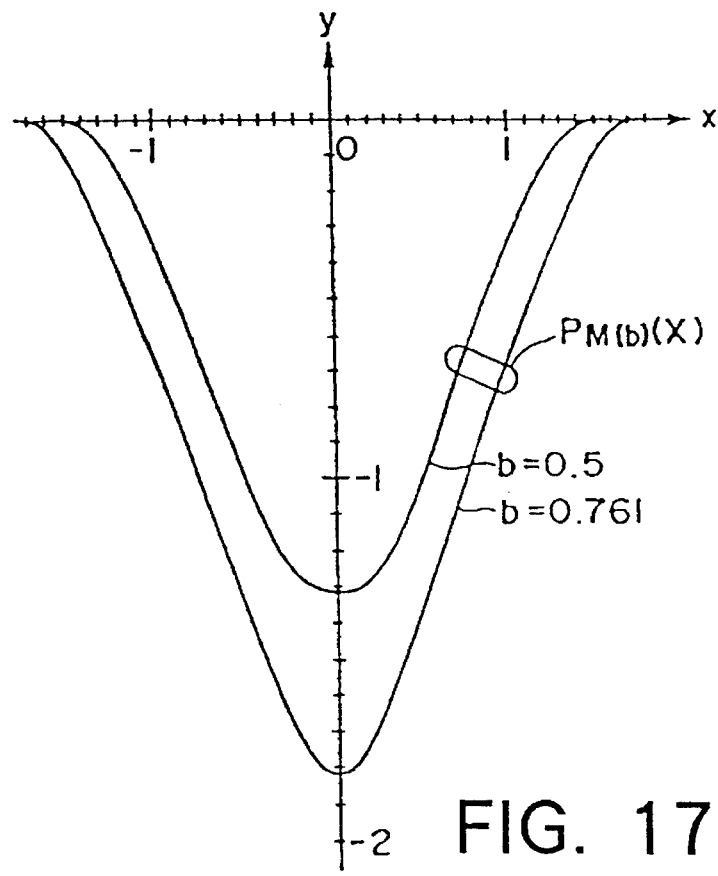
FIG. 17 is a diagram showing a characteristic of the output voltage of the full-wave rectifier shown in FIG. 6.

FIG. 17 represents the output rectifying characteristic of the MOS full-wave rectifiers shown in FIG. 16. The input-output characteristic which is approximate to the square-law characteristic can be obtained by superimposing a DC offset voltage on the differential input voltage. As it is clear from FIG. 17 or expression (27), by employing a full-wave rectifier which is shown in FIG. 16 and arranging so that the product of the tail current $I_O$ and the transconductance parameter $\beta$ is different for each full-wave rectifier and further multiplying the product by an appropriate constant less than 1 to obtain the DC offset voltage of the full-wave rectifier, full-wave rectifiers each having a different characteristic can be obtained. By parallelly connecting a plurality of full-wave rectifiers of this like each having a different characteristic, it becomes possible to obtain the pseudo logarithmic full-wave rectification characteristic. Therefore, it is possible to construct a logarithmic amplifying circuit by using the pseudologarithmic full-wave rectifiers shown in FIG. 16 in place of half-wave rectifiers $4_1$ to $4_{n+1}$ shown in FIG. 3.

Figure 18:
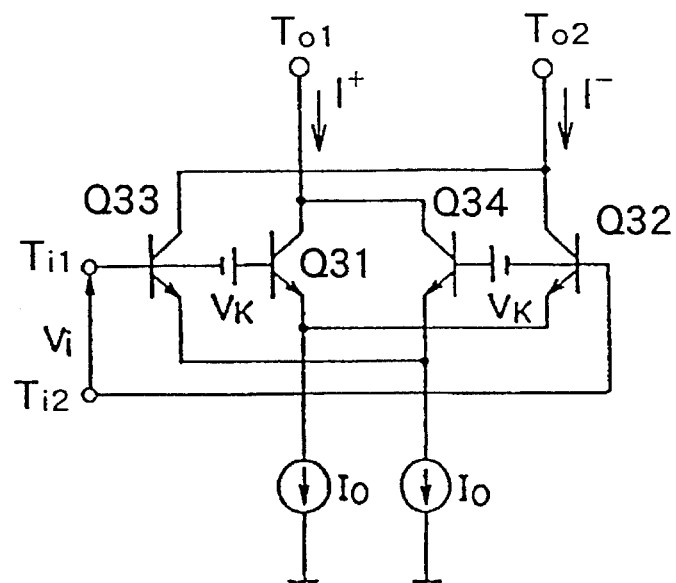
FIG. 18 is a circuit diagram showing the structure of a full-wave rectifier which employs MOS transistors and DC offset voltage sources.

In the same way as the above case which employs the MOS process, it is also possible to realize the full-wave rectifier by using the bipolar process. FIG. 18 shows the structure of a pseudologarithmic full-wave rectifier composed of two pairs of bipolar MOS differential pairs and two offset voltage source. A first differential pair is composed of bipolar transistors Q31, Q32, a second differential pair is composed of bipolar transistors Q33, Q34. A constant current source is provided for each differential pair to cause the tail current $I_O$ of the identical strength to flow. Transistors Q31 through Q34 have each the identical characteristic. Collectors of transistors Q31, Q34 are connected to one output terminal $T_{o1}$, and collectors of the remaining transistors Q32, Q33 are connected to the other output terminal $T_{o2}$. The base of the transistor Q31 is connected to one input terminal $T_{i1}$ through the offset voltage source with a voltage $V_k$. At this time, the polarity of the offset voltage source $V_k$ is positive on the base side of the transistor 31. Further, the base of the transistor M33 is directly connected to the input terminal $T_{i1}$. On the other hand, the base of the transistor M32 is directly connected to the other input terminal $T_{i2}$, and the base of the transistor M34 is also connected to the other input terminal $T_{i2}$ through the other offset voltage source with the voltage $V_k$. Here, the polarity of the offset voltage source $V_k$ is positive on the base side of the transistor 34. Consequently, with reference to the differential input voltage $V_i$, DC offset voltages of mutually reverse polarity are applied respectively on the input voltage of each differential pair.

The differential output current $\Delta I_{OSB}$ of two emitter-coupled differential pairs shown in FIG. 18 is given by equation (30) as follows.

$$\begin{aligned}\Delta I_{OSB} &= I^+ - I^- = (I_{C1} + I_{C4}) - (I_{C2} + I_{C3}) \\ &= \alpha_F I_O \left\{ \tanh\left(\frac{V_i - V_k}{2V_T}\right) - \tanh\left(\frac{V_i + V_k}{2V_T}\right) \right\} \\ &= -2\alpha_F I_O \left\{ \frac{\sinh\left(\frac{V_k}{V_T}\right)}{\cosh\left(\frac{V_i}{V_T}\right) + \cosh\left(\frac{V_k}{V_T}\right)} \right\} \end{aligned} \quad (30)$$

By normalizing equation (30), equation (31) is obtained.

$$p_{B(b)}(x) = \frac{\Delta I_{OSB}}{\alpha_F I_O} = f_B(x-b) - f_B(x+b) \quad (31A)$$

$$= -\frac{2\sinh\left(\frac{V_k}{V_T}\right)}{\cosh\left(\frac{V_i}{V_T}\right) + \cosh\left(\frac{V_k}{V_T}\right)}$$

where $f_B(x)$ is a normalized differential output current of the bipolar coordinate differential pair to be driven by the tail current $I_O$ and given by equation (32).

$$f_B(x) = \frac{\Delta I_C}{\alpha_F I_O} = \tanh\left(\frac{x}{2}\right) \quad (32)$$

Figure 19:
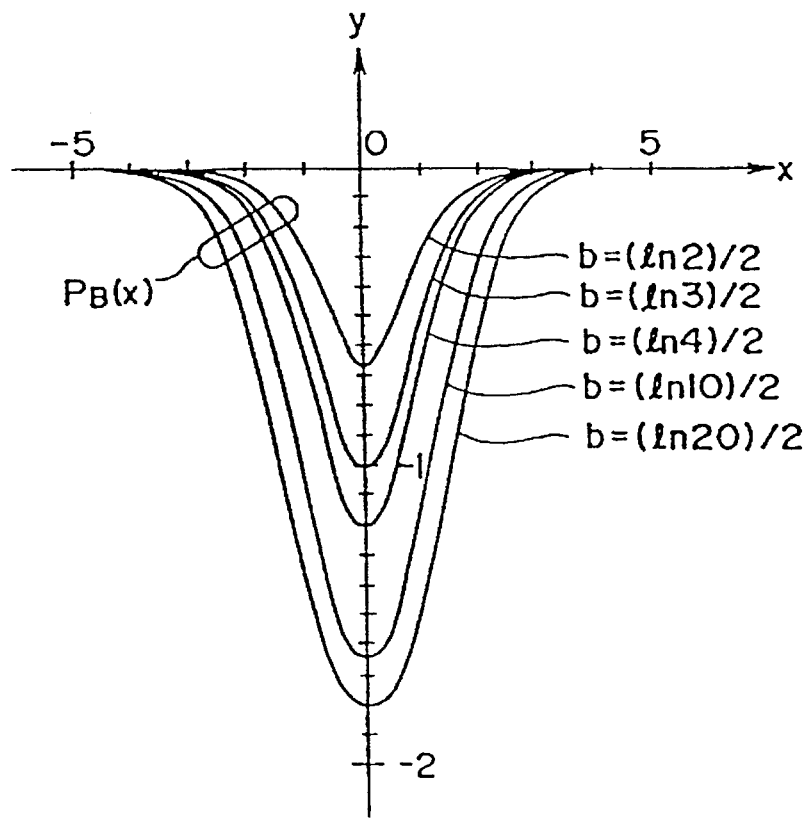
FIG. 19 is a diagram showing a characteristic of the output voltage of the full-wave rectifier shown in FIG. 18.

FIG. 19 represents the output rectifying characteristic of the bipolar MOS full-wave rectifiers shown in FIG. 18. As it is clear from FIG. 19, the input-output characteristic which is approximate to the square-law characteristic can be obtained by superimposing a DC offset voltage on the differential input voltage of the bipolar full-wave rectifier. If an emitter resistance is inserted to each differential pair of the bipolar full-wave rectifier, the slope of the curve representing the input-output characteristic becomes gentle causing the input voltage range to expand while maintaining the characteristic of the full-wave rectifier. Therefore, by inserting emitter resistances with different values to the bipolar differential pairs, fill-wave rectifiers each having a different characteristic can be obtained. By parallelly connecting the full-wave rectifiers each having a different characteristic, it become possible to construct a pseudologarithmic full-wave rectifier. It is possible to construct a logarithmic amplifying circuit by using the pseudologarithmic full-wave rectifiers shown in FIG. 16 in place of half-wave rectifiers $4_1$ to $4_{n+1}$ shown in FIG. 3.

It is to be understood that variations and modifications of the logarithmic amplifying circuit disclosed herein will be evident to those skilled in the art. It is intended that all such modifications and variations be included within the scope of the appended claims.

What is claimed is:

1. A logarithmic amplifying circuit comprising:
   a differential amplifier having an input terminal and an output terminal;
   a plurality of half-wave rectifiers, including a first and a second half-wave rectifier;
   said input terminal of said differential amplifier providing input to said first half-wave rectifier, and said output of said differential amplifier providing input to said second half-wave rectifier; and
   an adder for adding an output signal of each of said half-wave rectifiers;
   wherein each of said half-wave rectifiers further comprises:
   a differential pair composed of two transistors emitter-coupled or source-coupled;
   offset means for superimposing a DC offset voltage on a differential input voltage to be supplied to said differential pair; and
   said offset means being coupled to a gate terminal of only one of said two transistors.

2. The logarithmic amplifying circuit according to claim 1, wherein a plurality of said differential amplifiers are cascade-connected to constitute an amplifier series, and each respective output terminal of each of said plurality of differential amplifiers provides an input to a corresponding half-wave rectifier of said plurality of half-wave rectifiers.

3. The logarithmic amplifying circuit according to claim 1, wherein each of said half-wave rectifiers comprises a plurality of said differential pairs of different characteristics which are connected in parallel to constitute a pseudologarithmic half-wave rectifier.

4. A logarithmic amplifying circuit, comprising:
   a plurality of cascade-connected differential amplifiers;
   a plurality of half-wave rectifiers for receiving a differential input signal of a differential amplifier of each stage and a differential output signal of a differential amplifier of the last stage, respectively, and outputting differential currents corresponding to respective received input signals; and
   an adder for adding an-output current of each of said half-wave rectifiers and outputting a signal corresponding to the sum thus obtained;
   wherein each of said half-wave rectifiers further comprises:
   a differential pair composed of a single tail current source and two MOS transistors whose sources are connected to said tail current source; and
   offset means for superimposing a DC offset voltage on a differential input voltage to be supplied to said differential pair;

said offset means being coupled to a gate terminal of only one of said two MOS transistors;

wherein each gate of said two MOS transistors is provided for receiving said differential input signal to be supplied to each of said half-wave rectifiers, and each drain of said two MOS transistors is provided for transmitting output signal of each of said half-wave rectifiers.

5. The logarithmic amplifying circuit according to claim 4, wherein the characteristic of each of said MOS transistors included in the differential pair is substantially identical to each other for each of said differential pairs.

6. The logarithmic amplifying circuit according to claim 4, wherein each of said half-wave rectifiers is composed of a plurality of said differential pairs which are connected in parallel, and each of which have a different characteristic, to constitute a pseudologarithmic half-wave rectifier.

7. The logarithmic amplifying circuit according to claim 6, wherein said offset means is provided for each of said differential pairs.

8. The logarithmic amplifying circuit according to claim 6, wherein said differential pairs are different from each other in characteristic due to a transconductance parameter of each of said MOS transistors, which is changed for each of said differential pairs.

9. A logarithmic amplifying circuit, comprising:

a plurality of cascade-connected differential amplifiers;

a plurality of half-wave rectifiers for receiving a differential input signal of a differential amplifier of each stage and a differential output signal of a differential amplifier of the last stage, respectively, and outputting differential currents corresponding to respective received input signals; and an adder for adding an output current of each of said half-wave rectifiers and outputting a signal corresponding to the sum thus obtained;

wherein each of said half-wave rectifiers further comprises:

a differential pair composed of a single tail current source and two bipolar transistors whose emitters are connected to said tail current source; and offset means for superimposing a DC offset voltage on a differential input voltage to be supplied to said differential pair;

said offset means being coupled to a gate of only one of said two bipolar transistors;

wherein each gate of said bipolar transistors is provided for receiving differential input signal to be supplied to each of said half-wave rectifiers and each emitter of said bipolar transistors is provided for transmitting output signal of each of said half-wave rectifiers.

10. The logarithmic amplifying circuit according to claim 9, wherein the characteristic of each of said bipolar transistors included in the differential pair is substantially identical to each other for each of said differential pairs.

11. The logarithmic amplifying circuit according to claim 9, wherein each of said plurality of half-wave rectifiers is composed of a plurality of said differential pairs which are connected in parallel, each having a different characteristic, to constitute a pseudologarithmic half-wave rectifier.

12. The logarithmic amplifying circuit according to claim 11, wherein said offset means is provided for each of said differential pairs.

13. A logarithmic amplifying circuit, comprising:

a plurality of cascade-connected differential amplifiers;

a plurality of rectifiers, each of which receives a respective differential input signal from a corresponding one of said plurality of differential amplifiers, and each of which produces a respective differential current corresponding to said respective differential input signal; and an adder for adding each said respective differential current and outputting a signal corresponding to a sum thus obtained;

each of said plurality of rectifiers further comprising:

a respective plurality of differential pairs connected in parallel; and first and second offset means for superimposing a DC offset voltage on said respective differential input signal;

each differential pair of said respective plurality of differential pairs having a characteristic, and comprising:

a single tail current source; and two bipolar transistors;

emitters of said two bipolar transistors being connected to said tail current source and transmitting said respective differential current;

gates of said two bipolar transistors receiving said respective differential input signal;

said characteristic of each differential pair being different from said characteristic of other differential pairs within each respective plurality of differential pairs;

said first offset means consisting of a resistance inserted to one of said emitters of said two bipolar transistors; and said second offset means being commonly provided for each differential pair of said respective plurality of differential pairs.

14. A logarithmic amplifying circuit, comprising:

a plurality of cascade-connected differential amplifiers;

a plurality of rectifiers, each of which receives a respective differential input signal from a corresponding one of said plurality of differential amplifiers, and each of which produces a respective differential current corresponding to said respective differential input signal; and an adder for adding each said respective differential current and outputting a signal corresponding to a sum thus obtained;

each of said plurality of rectifiers further comprising:

a respective plurality of differential pairs connected in parallel; and offset means for superimposing a DC offset voltage on said respective differential input signal;

each differential pair of said respective plurality of differential pairs having a characteristic and comprising:

a single tail current source; and two bipolar transistors;

emitters of said two bipolar transistors being connected to said tail current source and transmitting said respective differential current;

gates of said two bipolar transistors receiving said respective differential input signal; and said characteristic of said differential pair being different from said characteristic of other differential pairs within each respective plurality of differential pairs;

wherein each differential pair of said respective plurality of differential pairs is a balanced differential pair.

15. The logarithmic amplifying circuit according to claim 11, wherein at least one of said differential pairs is an unbalanced differential pair.

16. The logarithmic amplifying circuit according to claim 11, wherein said differential pairs are different from each other in characteristic due to a emitter degeneration value of each of said bipolar transistors which is changed for each of said differential pairs.

17. A logarithmic amplifying circuit, comprising:

a plurality of cascade-connected differential amplifiers;

a plurality of full-wave rectifiers; and an adder;

each of said differential amplifiers providing a respective differential input signal to a corresponding one of said plurality of full-wave rectifiers;

each of said full-wave rectifiers outputting a respective differential current corresponding to said respective differential input signal; and said adder adding said respective differential current of each of said full-wave rectifiers and outputting a signal corresponding to a sum thus obtained;

wherein each of said full-wave rectifiers further comprises:

a double differential pair consisting of a first and a second differential pair, connected in parallel, having an identical characteristic, and defining a plurality of differential pairs; and offset means provided for each of said differential pairs for superimposing a DC offset voltage on said respective differential input signal;

wherein each of said differential pairs is composed of a tail current source and two transistors whose sources or emitters are commonly connected to said tail current source;

and wherein a polarity of said DC offset voltage to be applied by said offset means of said first differential pair and a polarity of said DC offset voltage to be applied by said offset means for said second differential pair are in reverse relationship to each other;

and wherein said offset means for each of said differential pairs is coupled with a gate terminal of only one of said two transistors.

18. A logarithmic amplifying circuit comprising:

a first differential amplifier having an amplifier input terminal and an amplifier output terminal;

a plurality of half-wave rectifiers, including a first half-wave rectifier and a second half-wave rectifier, each of which accepts a respective differential input voltage, and generates a respective output signal;

said amplifier input terminal providing said respective differential input voltage to said first half-wave rectifier;

said amplifier output terminal providing said respective differential input voltage to said second half-wave rectifier;

an adder for adding each said respective output signal;

each of said plurality of half-wave rectifiers comprising (1) a differential pair for accepting said respective differential input voltage, and (2) an offset DC voltage source;

each said differential pair comprising two transistors, including a first transistor and a second transistor;

said first transistor and said second transistor each having a gate terminal, and being either emitter-coupled or source-coupled; and said gate terminal of one of two transistors being coupled with said offset DC voltage source.

19. The logarithmic amplifying circuit as set forth in claim 18, further comprising:

a second differential amplifier having a respective amplifier input terminal and a respective amplifier output terminal;

said first and said second differential amplifier defining a plurality of differential amplifiers which are cascade-connected to constitute an amplifier series; and each said respective amplifier output terminal providing said respective differential input voltage to a corresponding half-wave rectifier of said plurality of half-wave rectifiers.

20. The logarithmic amplifying circuit as set forth in claim 19, wherein each of said plurality of rectifiers further comprises:

an additional differential pair;

said differential pair and said additional differential pair defining a plurality of differential pairs;

each differential pair of said plurality of differential pairs having a different respective characteristic; and said plurality of differential pairs being connected in parallel to constitute a pseudologarithmic half-wave rectifier.

21. The logarithmic amplifying circuit as set forth in claim 19, wherein:

each of said two transistors is a MOS transistor;

a source of said first transistor and a source of said second transistor are connected in common to a tail current source;

each of said plurality of half-wave rectifiers further comprises a first and a second half-wave rectifier input terminal, and a first and a second half-wave rectifier output terminal;

said respective differential input voltage is supplied to said first and said second half-wave rectifier input terminal;

said first half-wave rectifier input terminal is coupled to said gate terminal of said first transistor, and said second half-wave rectifier input terminal is coupled to said gate terminal of said second transistor;

a drain of said first transistor is coupled to said first half-wave rectifier output terminal;

a drain of said second transistor is coupled to said second half-wave rectifier output terminal; and said first and said second half-wave rectifier output terminal supply said respective output signal.

22. The logarithmic amplifying circuit as set forth in claim 21, wherein:

said first transistor and said second transistor have a substantially identical respective characteristic.

23. The logarithmic amplifying circuit as set forth in claim 21, wherein each of said plurality of rectifiers further comprises:

an additional differential pair;

said differential pair and said additional differential pair defining a plurality of differential pairs;

each differential pair of said plurality of differential pairs having a different respective characteristic; and said plurality of differential pairs being connected in parallel to constitute a pseudologarithmic half-wave rectifier.

24. The logarithmic amplifying circuit as set forth in claim 23, wherein:

each differential pair of said plurality of differential pairs has a respective offset DC voltage source coupled to a respective gate terminal of a respective one of said two transistors.

25. The logarithmic amplifying circuit as set forth in claim 23, wherein:

said different respective characteristic is due to a different respective transconductance parameter.

* * * * *

UNITED STATES PATENT AND TRADEMARK OFFICE
CERTIFICATE OF CORRECTION

PATENT NO. : 5,506,537
DATED : April 9, 1996
INVENTOR(S) : Katsuji KIMURA

It is certified that error(s) appears in the above-identified patent and that said Letters Patent is hereby corrected as shown below:

Column 9, line 7, delete "$I_{oi}$" and insert --$I_{oj}$--.

Column 12, line 20, delete "$\div$" and insert --$\doteqdot$--.

Signed and Sealed this

Thirteenth Day of August, 1996

Attest:

BRUCE LEHMAN

*Attesting Officer*    *Commissioner of Patents and Trademarks*